United States Patent
Fukuda et al.

(10) Patent No.: US 8,836,010 B2
(45) Date of Patent: Sep. 16, 2014

(54) NONVOLATILE SEMICONDUCTOR MEMORY DEVICE AND METHOD OF MANUFACTURING THE SAME

(75) Inventors: Koichi Fukuda, Yokohama (JP); Rieko Tanaka, Yokohama (JP); Takumi Abe, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 16 days.

(21) Appl. No.: 13/344,765

(22) Filed: Jan. 6, 2012

(65) Prior Publication Data

US 2012/0168851 A1  Jul. 5, 2012

Related U.S. Application Data

(63) Continuation of application No. 12/564,615, filed on Sep. 22, 2009, now Pat. No. 8,106,445.

(30) Foreign Application Priority Data

Oct. 3, 2008  (JP) .................................. 2008-258804

(51) Int. Cl.
  *H01L 29/792* (2006.01)
  *H01L 27/115* (2006.01)
  *H01L 27/105* (2006.01)
  *H01L 49/02* (2006.01)

(52) U.S. Cl.
  CPC ........ *H01L 27/11531* (2013.01); *H01L 27/105* (2013.01); *H01L 28/24* (2013.01); *H01L 27/11526* (2013.01)
  USPC .................................... 257/324; 257/E27.06

(58) Field of Classification Search
  CPC .............. H01L 45/1233; H01L 27/105; H01L 27/2436; H01L 45/146; H01L 27/11526
  See application file for complete search history.

(56) References Cited

U.S. PATENT DOCUMENTS

| 6,534,867 | B1 | 3/2003 | Kamiya et al. |
| 6,703,680 | B2 * | 3/2004 | Toyoshima ................... 257/529 |
| 6,894,361 | B2 | 5/2005 | Kanai |

(Continued)

FOREIGN PATENT DOCUMENTS

| JP | 63-133563 A | 6/1988 |
| JP | 2003-45980 A | 2/2003 |
| JP | 2004-200504 A | 7/2004 |
| JP | 2007-134681 A | 5/2007 |

OTHER PUBLICATIONS

Office Action issued Mar. 26, 2013, in Japanese Patent Application No. 2008-258804 with English translation.

*Primary Examiner* — Tony Tran
(74) *Attorney, Agent, or Firm* — Oblon, Spivak, McClelland, Maier & Neustadt, L.L.P.

(57) ABSTRACT

A nonvolatile semiconductor memory device including a memory cell configured to store data and a resistor element provided around the memory cell. The memory cell includes a charge storage layer provided above a substrate, a first semiconductor layer formed on a top surface of the charge storage layer via an insulating layer, and a first low resistive layer formed on a top surface of the first semiconductor layer and having resistance lower than that of the first semiconductor layer. The resistor element includes a second semiconductor layer formed on the same layer as the first semiconductor layer, and a second low resistive layer formed on the same layer as the first low resistive layer and on a top surface of the second semiconductor layer, having resistance lower than that of the second semiconductor layer.

16 Claims, 19 Drawing Sheets

(56) References Cited

U.S. PATENT DOCUMENTS

| | | |
|---|---|---|
| 7,011,999 B2 | 3/2006 | Minami et al. |
| 7,486,559 B2 | 2/2009 | Morooka et al. |
| 7,560,767 B2 | 7/2009 | Yasuda et al. |
| 7,590,004 B2 | 9/2009 | Abe et al. |
| 2006/0220003 A1 | 10/2006 | Noguchi et al. |
| 2009/0095995 A1 | 4/2009 | Kawashima et al. |
| 2010/0237404 A1 | 9/2010 | Toba et al. |

* cited by examiner

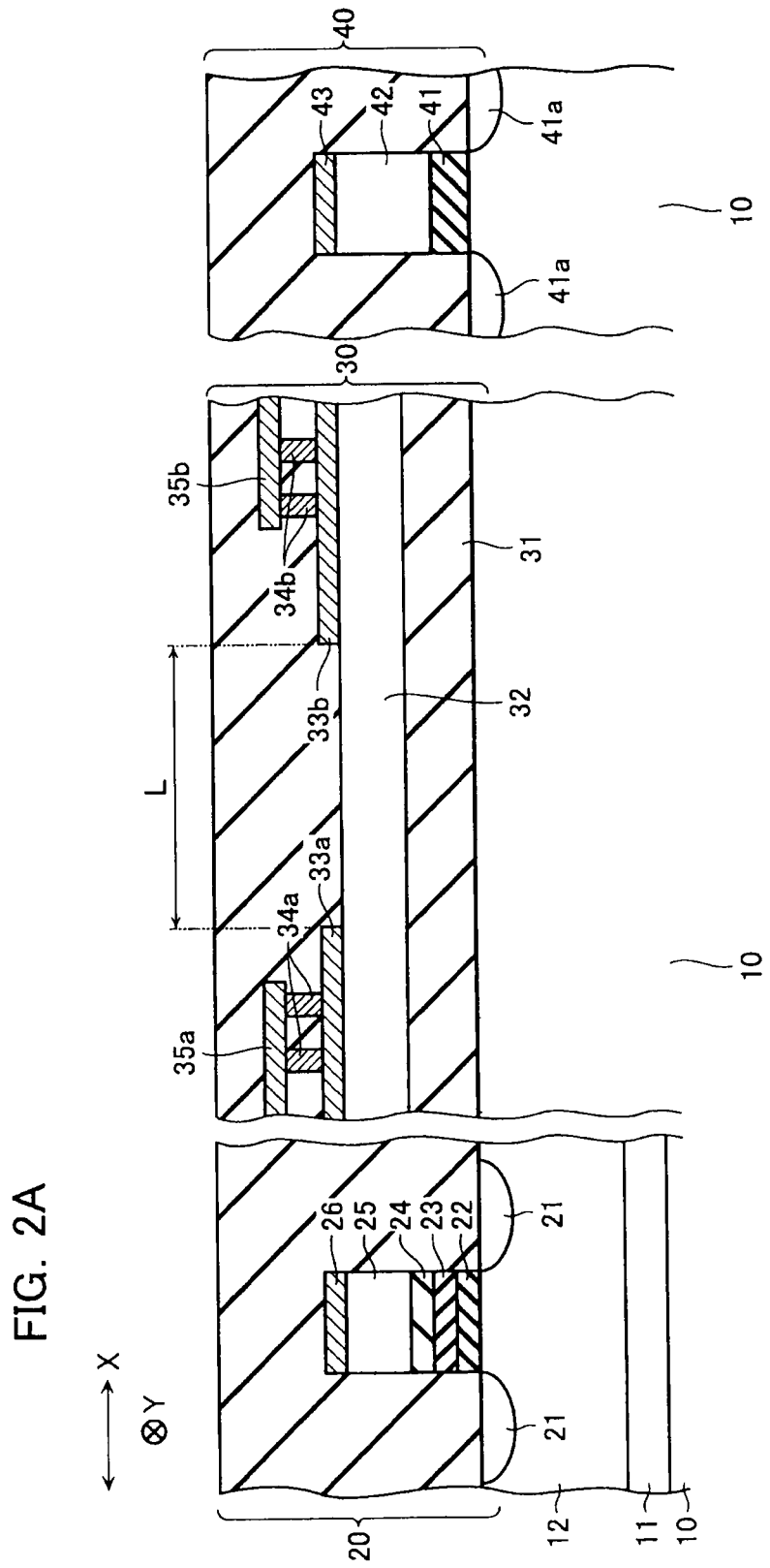

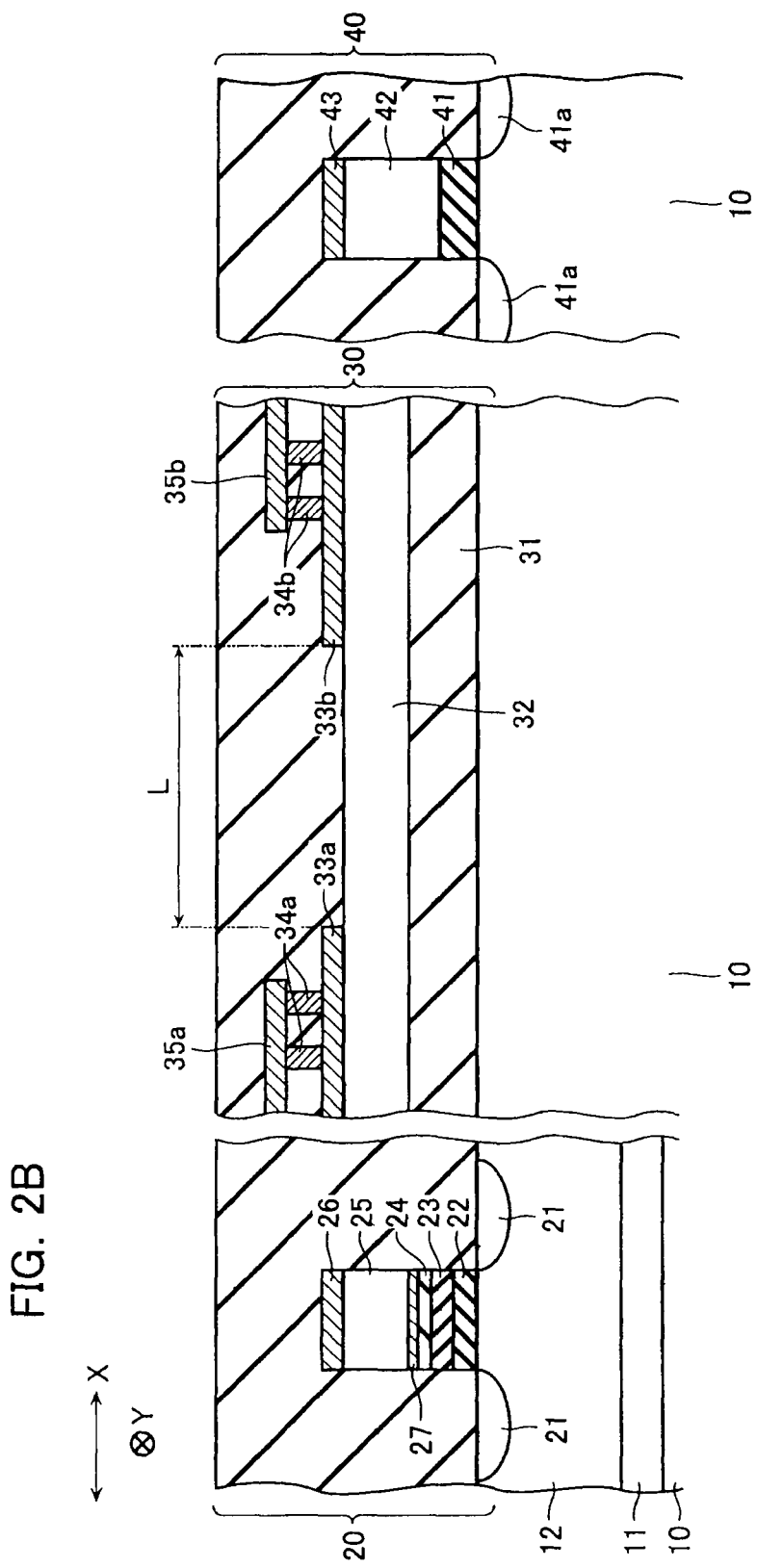

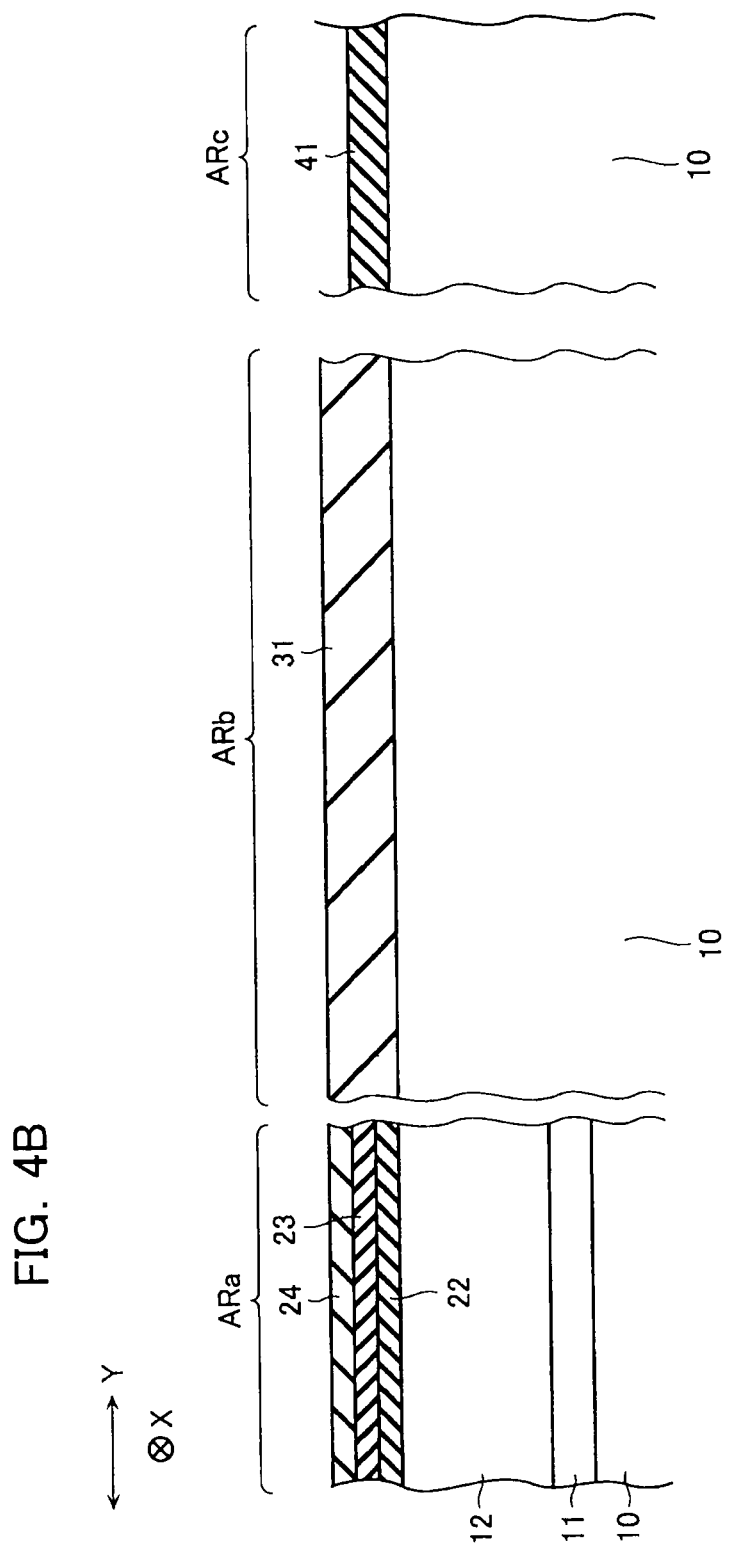

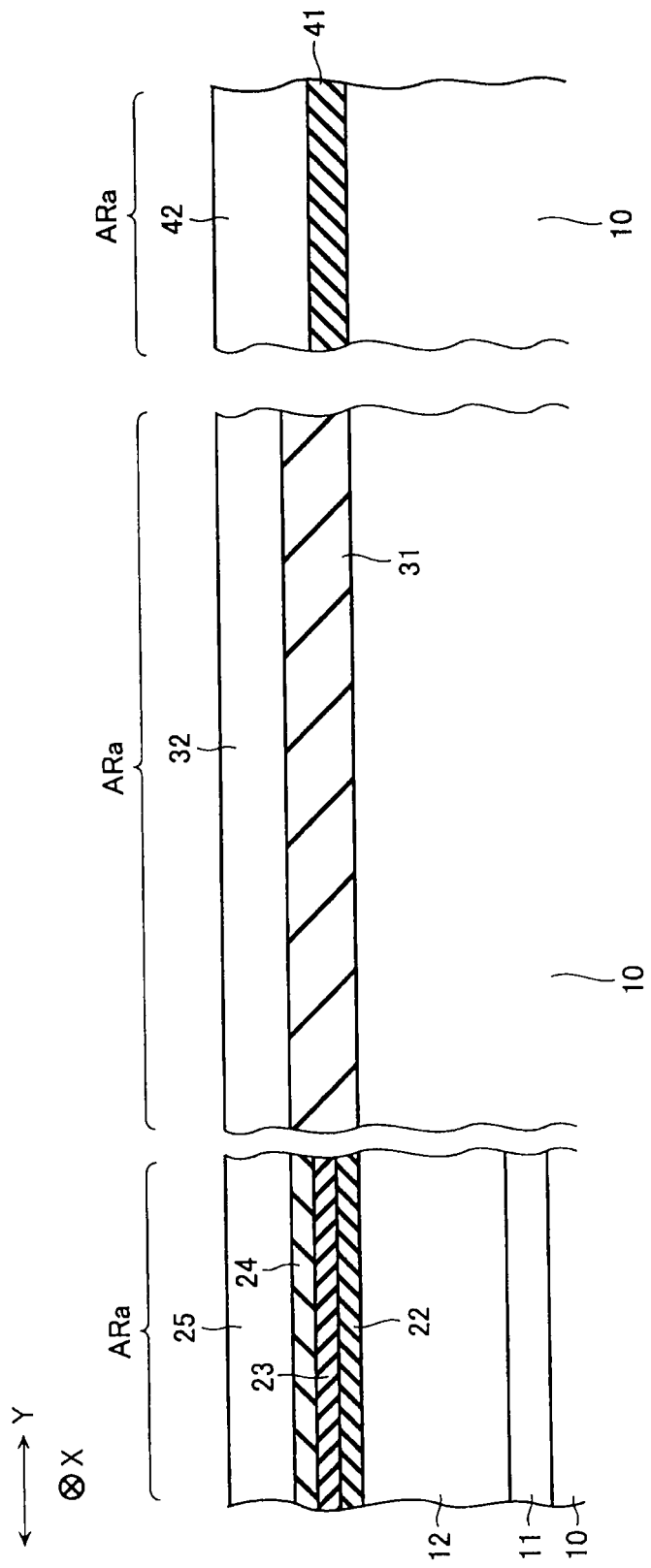

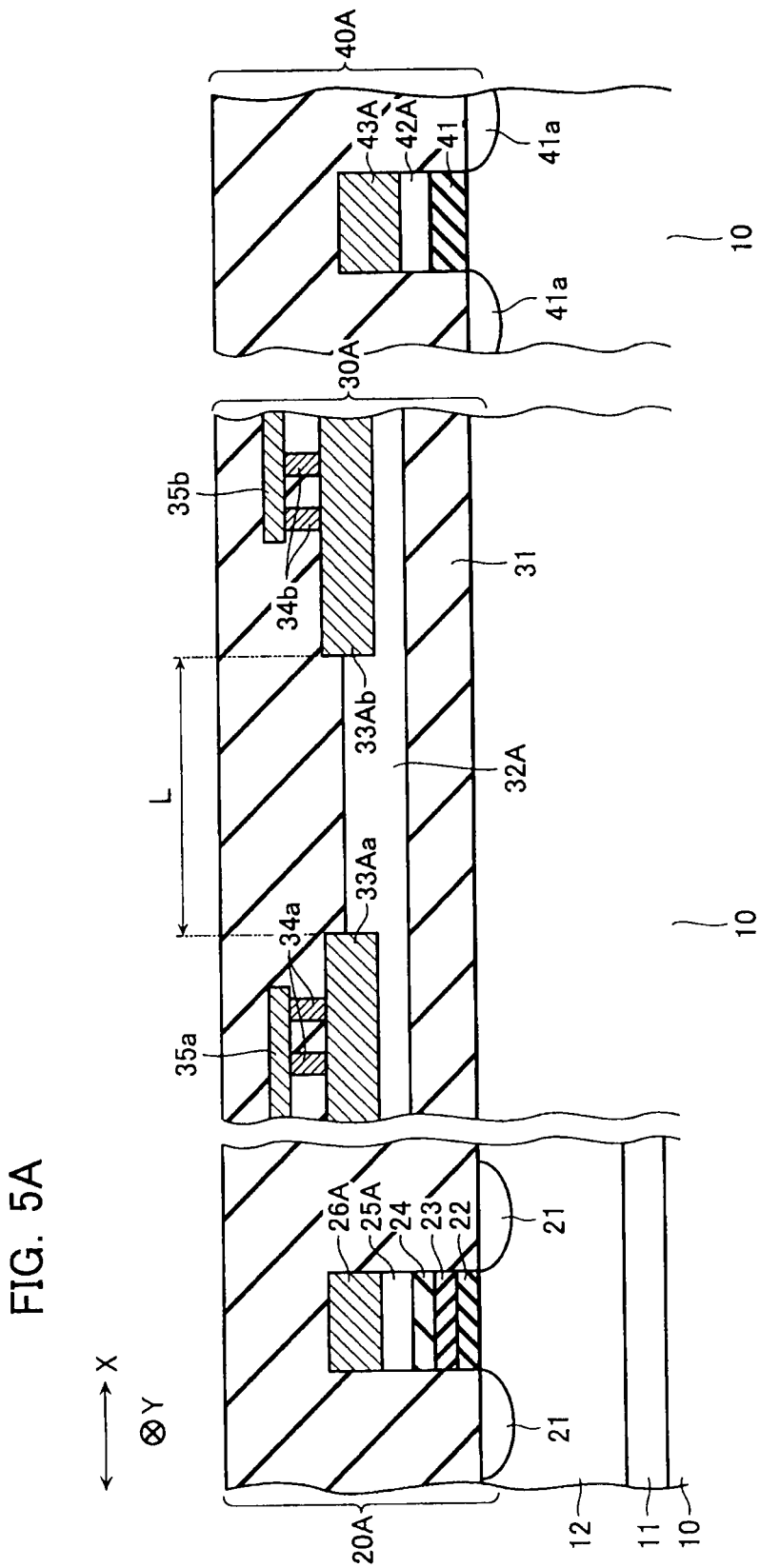

US 8,836,010 B2

NONVOLATILE SEMICONDUCTOR MEMORY DEVICE AND METHOD OF MANUFACTURING THE SAME

CROSS-REFERENCE TO RELATED APPLICATIONS

The present application is a continuation of U.S. patent application Ser. No. 12/564,615, filed on Sep. 22, 2009, which claims priority to Japanese patent application JP 2008-258804, filed on Oct. 3, 2008, the contents of which are hereby incorporated by reference in their entirety.

BACKGROUND OF THE INVENTION

1. Field of the Invention

The present invention relates to a nonvolatile semiconductor memory device that can electrically rewrite data and a method of manufacturing the same.

2. Description of the Related Art

Resistor elements have been widely used in analog electric circuits. Examples of the analog circuit using a resistor element may include an RC delay circuit, a reference potential generation circuit, a regulator of voltage booster, and a regulator in a voltage down-converter. In particular, in a nonvolatile semiconductor memory device such as a NAND-type flash memory, various internal voltages are generated. Accordingly, the nonvolatile semiconductor memory device has a plurality of analog circuits mounted thereon and uses a large number of resistor elements.

As the resistor elements used in the nonvolatile semiconductor memory device, three types of resistor elements, i.e. (A) a resistor element using a diffusion layer, (B) a resistor element using polysilicon (for example, refer to Japanese Patent Application Laid-Open No. 2007-266499), and (C) a resistor element using a metal wiring line (for example, tungsten) having a relatively high resistance value are mainly used. A sheet resistance value of the resistor element (A) is the highest, that of the resistor elements (B) is lower than that of the resistor element (A), and that of the resistor element (C) is lowest. The diffusion layer of (A) can provide a resistor element that has a high resistance value and a small area. However, since a width of a depletion layer that is generated in an end of the diffusion layer varies depending on an applied voltage, the area of the diffusion layer related to electric conduction varies according to the variation in the width of the depletion layer. That is, the resistance value depends on the applied voltage. This characteristic is not preferable as a characteristic of a resistor element. That is why the resistor element (A) is rarely used in an analog circuit that needs a resistance value with high precision. The resistance value of the resistor element (C) does not depend on the voltage. However, since the resistor element (C) is made of metal and has a low resistance value, an area to achieve a large resistance value is large. Under these circumstances, though a resistor element (B) using the polysilicon has an area relatively wider than that of the resistor element (A), the resistor element (B) using the polysilicon is frequently used in an analog circuit.

In manufacturing processes of the nonvolatile semiconductor memory device, a change in a process such as a thermal process is sometimes conducted for, improvement of a yield, reliability of a device, and a characteristic of a device. For this reason, the resistance value of the resistor element formed of polysilicon may be greatly changed. That is, an operation of a circuit using the resistor element cannot be ensured. In order to solve the above-described problems, a mask used at the time of etching the polysilicon needs to be made again. Accordingly, in the resistor element used in the nonvolatile semiconductor memory device, a manufacturing process that can easily change a resistance value is required.

SUMMARY OF THE INVENTION

According to an aspect of the present invention, there is provided a nonvolatile semiconductor memory device comprising: a memory cell configured to stores data; and a resistor element provided around the memory cell, the memory cell including: a charge storage layer provided above a substrate and configured to accumulate charges; a first semiconductor layer that is formed on a top surface of the charge storage layer via an insulating layer; and a first low resistive layer formed on a top surface of the first semiconductor layer and having a resistance lower than that of the first semiconductor layer, the resistor element includes: a second semiconductor layer formed on the same layer as the first semiconductor layer; and a second low resistive layer formed on the same layer as the first low resistive layer and on a top surface of the second semiconductor layer, the second low resistive layer having a resistance lower than that of the second semiconductor layer, the second semiconductor layer being formed to extend in a first direction parallel to the substrate, and the second low resistive layer being formed at both ends of the second semiconductor layer in the first direction.

According to another aspect of the present invention, there is provided a method of manufacturing a nonvolatile semiconductor memory device that comprises a first area including a memory cell storing data and a second area including a resistor element provided around the first area, the method comprising: forming a charge storage layer accumulating a charge above a substrate, in the first area; forming a first semiconductor layer on a top surface of the charge storage layer with an insulating layer interposed therebetween, in the first area, and forming a second semiconductor layer on the same layer as the first semiconductor layer above the substrate, in the second area; and forming a first low resistive layer having resistance lower than that of the first semiconductor layer on a top surface of the first semiconductor layer, in the first area, and forming a second low resistive layer having resistance lower than that of the second semiconductor layer, in the second area.

BRIEF DESCRIPTION OF THE DRAWINGS

FIG. 2A is a cross-sectional view illustrating the nonvolatile semiconductor memory device according to the first embodiment;

FIG. 2B is a cross-sectional view illustrating a nonvolatile semiconductor memory device according to a modification of the first embodiment;

FIG. 4B is a cross-sectional view taken along Y direction, illustrating a manufacturing process of the nonvolatile semiconductor memory device according to the first embodiment;

FIG. 4D is a cross-sectional view taken along Y direction, illustrating a manufacturing process of the nonvolatile semiconductor memory device according to the first embodiment;

FIG. 5A is a cross-sectional view illustrating a nonvolatile semiconductor memory device according to a second embodiment of the present invention;

DETAILED DESCRIPTION OF THE EMBODIMENTS

Hereinafter, embodiments of a nonvolatile semiconductor memory device according to the present invention will be described with reference to the accompanying drawings.

First Embodiment

Figure 1:
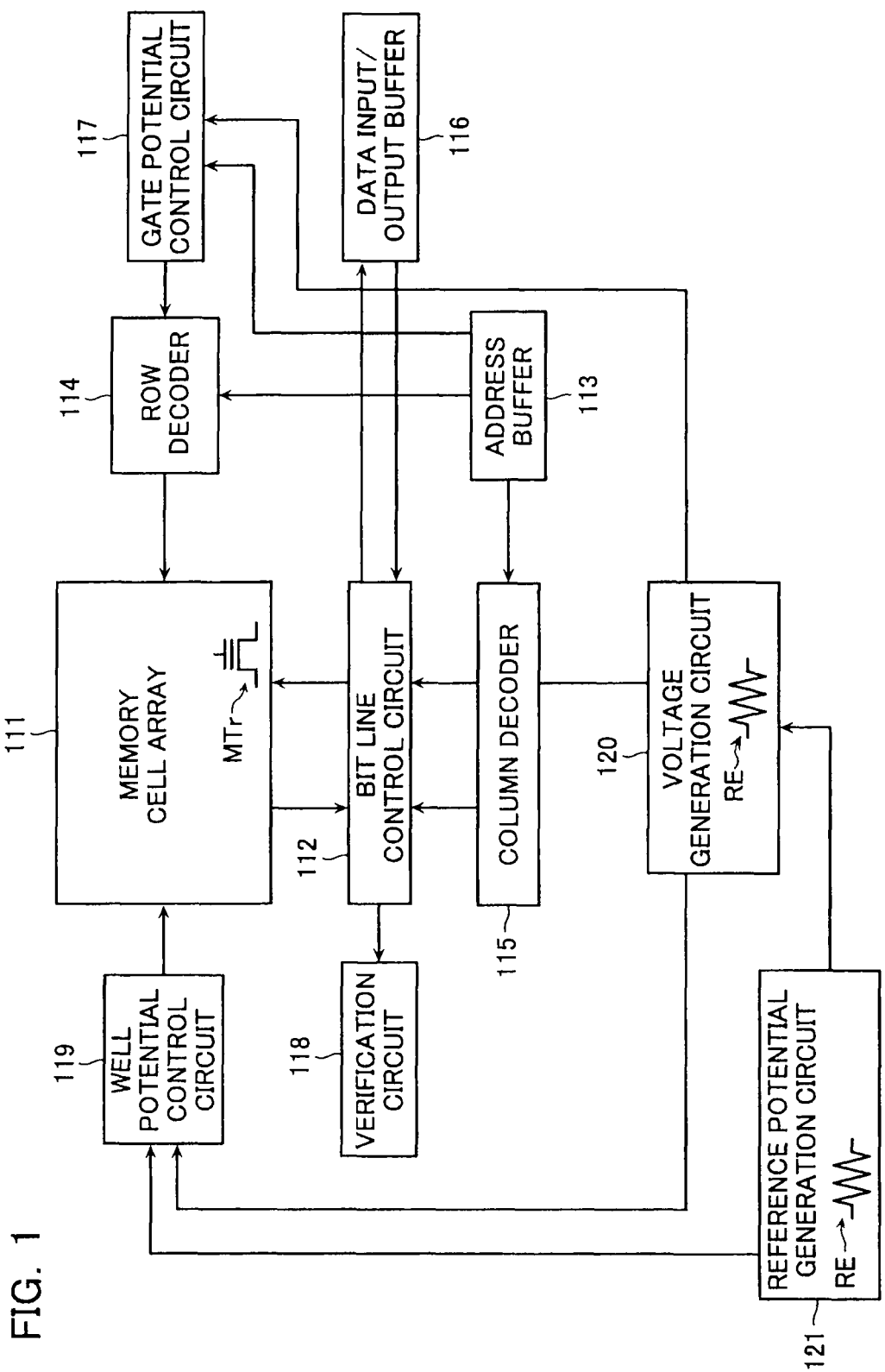
FIG. 1 is a block diagram illustrating a nonvolatile semiconductor memory device according to a first embodiment of the present invention.

Block Configuration of a Nonvolatile Semiconductor Memory Device According to a First Embodiment FIG. 1 illustrates the block configuration of a nonvolatile semiconductor memory device (NAND-type EEPROM flash memory) according to a first embodiment of the present invention. As illustrated in FIG. 1, the nonvolatile semiconductor memory device according to the first embodiment includes a memory cell array 111, a bit line control circuit 112, an address buffer 113, a row decoder 114, a column decoder 115, a data input/output buffer 116, a gate potential control circuit 117, a verification circuit 118, a well potential control circuit 119, a voltage generation circuit 120, and a reference potential generation circuit 121.

The memory cell array 111 has a memory transistor MTr that electrically stores data. The bit line control circuit 112 senses read dada of the memory cell array 111 and latches write data. The address buffer 113 receives an address signal Add, and generates and outputs a row address signal and a column address signal. The row decoder 114 and the column decoder 115 decode the received address signal Add. The data input/output buffer 116 temporarily stores output data amplified by the bit line control circuit 112, and outputs the output data at predetermined timing. The gate potential control circuit 117 controls gate potentials that are applied to gates of the transistors provided in the row decoder 114. The verification circuit 118 confirms that a write operation or an erasure operation has been completed, based on the data read by the bit line control circuit 112. The well potential control circuit 119 adjusts the potential of the well or the substrate where the memory cell array 111 is formed. The voltage generation circuit 120 generates various voltages based on a reference potential. The reference potential generation circuit 121 generates the reference potential. The voltage generation circuit 120 and the reference potential generation circuit 121 have resistor elements RE.

(Lamination Structure of the Nonvolatile Semiconductor Memory Device According to the First Embodiment)

Figure 3:
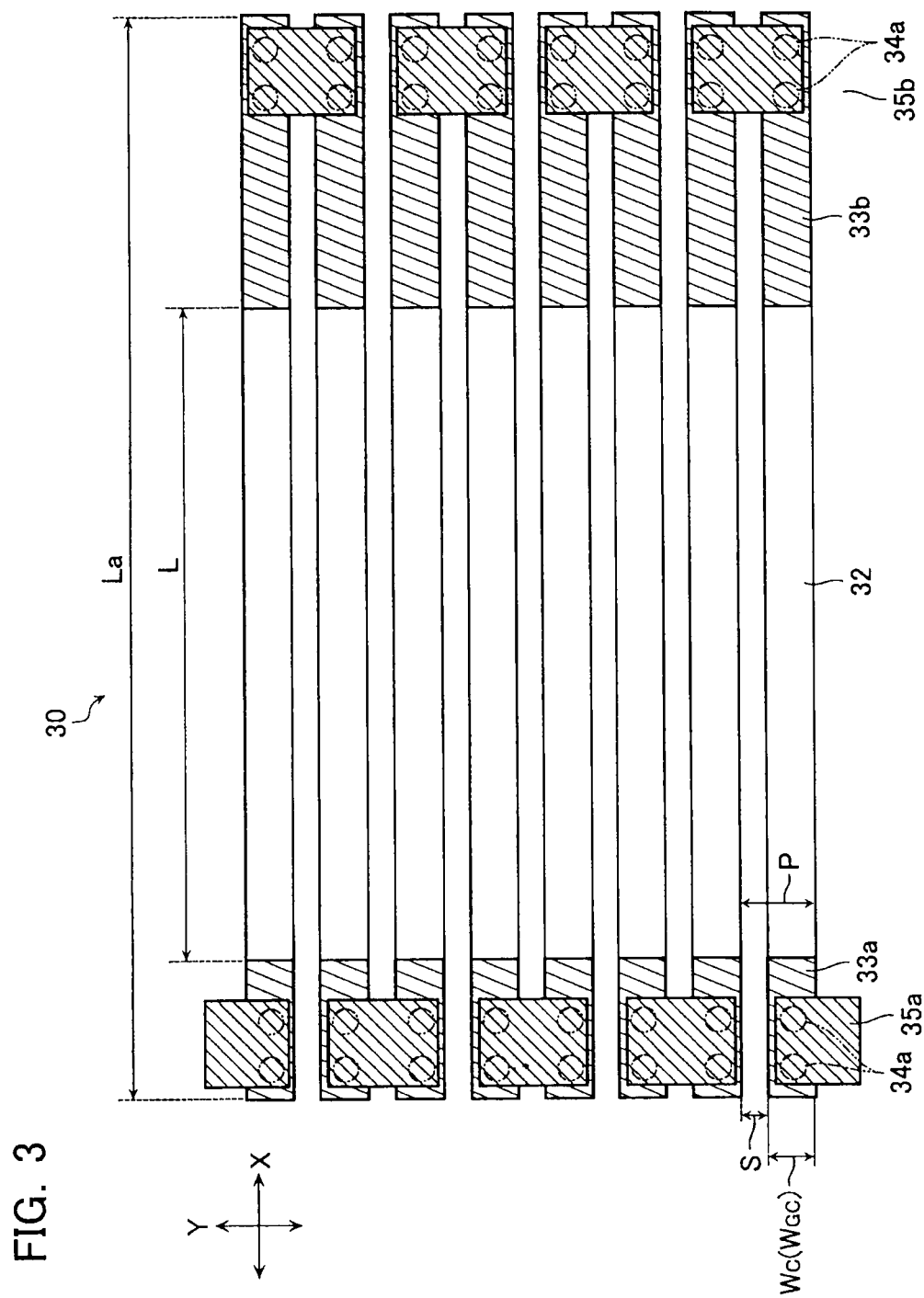
FIG. 3 is a top view illustrating a resistive layer 30 of the nonvolatile semiconductor memory device according to the first embodiment.

Next, referring to FIGS. 2A and 3, the lamination structure of the nonvolatile semiconductor memory device according to the first embodiment will be described. FIG. 2A is a cross-sectional view illustrating the nonvolatile semiconductor memory device according to the first embodiment. FIG. 3 is a top view illustrating a resistive layer 30, which will be described in detail below. Note that, in the description below, a certain direction that is parallel to a P-type semiconductor substrate 10 is assumed to be an X direction, and a direction that is orthogonal to a lamination direction and the X direction is assumed to be a Y direction.

As illustrated in FIG. 2A, the nonvolatile semiconductor memory device according to the first embodiment includes a memory layer 20, a resistive layer 30, and a transistor layer 40. The memory layer 20 is provided in the memory cell array 111 and functions as the memory transistor MTr. The resistive layer 30 is provided in, for example, the voltage generation circuit 120 and the reference potential generation circuit 121 and functions as the resistor element RE. The transistor layer 40 functions as a transistor Tr used in various circuits.

The memory layer 20 includes an N-type diffusion layers 21 that are provided in an N-type well 11 and a P-type well 12 formed on the P-type semiconductor substrate 10. The N-type diffusion layers 21 are formed at a certain interval in the X direction.

The memory layer 20 includes a tunnel insulating layer 22, a charge storage layer 23, a block insulating layer 24, a semiconductor layer 25, and a silicide layer 26, which are sequentially formed on the P-type semiconductor substrate 10. The memory layer 20 is configured to have a so-called MONOS structure or SONOS structure. Between the block insulating layer 24 and the semiconductor layer 25, a metal compound layer 27 such as TaN to improve an erasure characteristic may be further inserted, as illustrated in FIG. 2B.

The tunnel insulating layer 22 is formed on the P-type semiconductor substrate 10 to bridge the diffusion layer 21. The charge storage layer 23 is formed on a top surface of the tunnel insulating layer 22. The charge storage layer 23 is configured to accumulate charges. The block insulating layer 24 is formed on a top surface of the charge storage layer 23. The semiconductor layer 25 is formed on a top surface of the block insulating layer 24 and functions as a control gate of the memory transistor MTr. The silicide layer 26 is formed on a top surface of the semiconductor layer 25. The silicide layer 26 has resistance lower than that of the semiconductor layer 25. For example, the resistance of the silicide layer 26 is about $1/100$ to $1/10$ of the resistance of the semiconductor layer 25.

The tunnel insulating layer 22 includes silicon oxide ($SiO_2$), and the charge storage layer 23 includes silicon nitride (SiN). The block insulating layer 24 includes aluminum oxide ($Al_2O_3$), and the semiconductor layer 25 includes polysilicon (Si). The silicide layer 26 includes silicide, such as nickel silicide (NiSi), tungsten silicide (WSi), and cobalt silicide (CoSi).

The memory layer 20 having the above configuration accumulates a charge in the charge storage layer 23 to store data.

The resistive layer 30 is formed having a certain pitch in the Y direction. The resistive layer 30 includes an interlayer insulating layer 31, a semiconductor layer 32, a silicide layer 33a (silicide layer 33b), a plug layer 34a (plug layer 34b), and a wiring layer 35a (wiring layer 35b), which are sequentially laminated on the P-type semiconductor substrate 10. As a material for forming the interlayer insulating layer 31, a gate oxide film of a high-voltage transistor (not shown) can be used.

The transistor layer 40 includes diffusion layers 41a that are provided on the P-type semiconductor substrate 10, or on the P-type well or the N-type well formed on the P-type semiconductor substrate 10. The diffusion layers 41a are formed at a certain interval.

The transistor layer 40 includes a gate insulating layer 41, a semiconductor layer 42, and a silicide layer 43, which are sequentially formed on the P-type semiconductor substrate 10. The transistor layer 40 is formed to have a so-called MOS structure. In general, in the nonvolatile semiconductor memory device such as the NAND-type flash memory, both a high-voltage transistor and a low-voltage transistor exist. The thickness of the gate insulating layer 41 of the low-voltage transistor is about 7 to 9 nm, and the thickness of the gate insulating layer 41 of the high-voltage transistor is about 30 to 40 nm.

The gate insulating layer 41 includes silicon oxide ($SiO_2$), and the semiconductor layer 42 includes polysilicon (Si). The silicide layer 43 includes silicide, such as nickel silicide (NiSi), tungsten silicide (WSi), and cobalt silicide (CoSi).

The semiconductor layer 32 is formed on the same layer as the semiconductor layer 25 of the memory layer 20. The silicide layers 33a and 33b are formed on the same layer as the silicide layer 26 of the memory layer 20.

As illustrated in FIG. 3, the semiconductor layers 32 are formed in a stripe shape that extends in the X direction as viewed from above. The semiconductor layers 32 are arranged at a certain pitch P in the Y direction. The semiconductor layer 32 is formed to have a length La in the X direction.

The silicide layers 33a and 33b have resistance lower than that of the semiconductor layer 32. For example, the resistance of the silicide layers 33a and 33b is about 1/100 to 1/10 of the resistance of the semiconductor layer 32. The silicide layers 33a and 33b are formed in a plate shape that extends in the X direction. The silicide layer 33a is formed in one end of the semiconductor layer 32 in the X direction. The silicide layer 33b is formed in the other end of the semiconductor layer 32 in the X direction. In other words, the silicide layers 33a and 33b are formed on both ends of the semiconductor layer 32 at an interval L in the X direction.

The two plug layers 34a and 34b are formed in a columnar shape to extend in a lamination direction from the top surfaces of the silicide layers 33a and 33b. The wiring layers 35a and 35b are formed to contact the top surfaces of the plug layers 34a and 34b. Since the two plugs are formed, it is possible to suppress a connection failure that may occur between the silicide layer and the wiring layer when the plug is abnormally formed.

The interlayer insulating layer 31 includes silicon oxide ($SiO_2$), and the semiconductor layer 32 includes polysilicon (Si). The silicide layers 33a and 33b include nickel silicide (NiSi), tungsten silicide (WSi) or cobalt silicide (CoSi). The plug layers 34a and 34b and the wiring layers 35a and 35b include metal such as tungsten (W).

Specifically, a width $W_{GC}$ of the semiconductor layer 32 in the Y direction and a width $W_C$ of the silicide layers 33a and 33b in the Y direction are 0.3 μm. A distance S at which the resistive layers 30 are closest to each other in the Y direction is 0.1 μm. That is, the pitch P of the semiconductor layer 32 in the Y direction is 0.4 μm ($W_{GC}$+S or $W_C$+S).

Here, a resistance value of the resistive layer 30 will be described. If resistance values of the two plug layers 34a and 34b are "$R_{CS}$", resistance values of the silicide layers 33a and 33b are "$R_{SILI}$", and a resistance value of the semiconductor layer 32 between the silicide layers 33a and 33b is "$R_{SEMI}$", a resistance value R of the resistor element RE that is configured between both ends of the resistive layer 30 is represented by the following Equation 1:

$$R = R = \left(\frac{R_{CS}}{2} + R_{SILI}\right) \times 2 + R_{SEMI} \qquad \text{[Equation 1]}$$

In Equation 1, the resistance values "$R_{CS}$" and "$R_{SILI}$" are significantly smaller than the resistance value "$R_{SEMI}$". Accordingly, the resistance value "R" mainly depends on the resistance value "$R_{SEMI}$". If resistivity of the semiconductor layer 32 is "ρs" and the thickness of the semiconductor layer 32 in the lamination direction is "H", the above Equation 1 is replaced by the following Equation 2:

$$R \approx R_{SEMI} = \frac{L}{W_{GC} \times H} \times \rho_S \qquad \text{[Equation 2]}$$

In Equation 2, the resistance value "R" of the resistive layer 30 greatly depends on an interval "L" between the silicide layers 33a and 33b. Accordingly, the resistance value of the resistor element RE can be changed by changing the interval L.

(Method of Manufacturing a Nonvolatile Semiconductor Memory Device According to the First Embodiment)

Next, a method of manufacturing a nonvolatile semiconductor memory device according to the first embodiment will be described with reference to FIGS. 4A to 4E. FIGS. 4A to 4E schematically illustrate a part of manufacturing processes of the nonvolatile semiconductor memory device according to the first embodiment.

The manufacturing processes are executed with respect to a memory area ARa including the memory transistor MTr for storing data, a resistor area ARb including the resistor element RE provided around the memory area ARa, and a transistor area ARc including the transistor Tr.

Figure 4A:
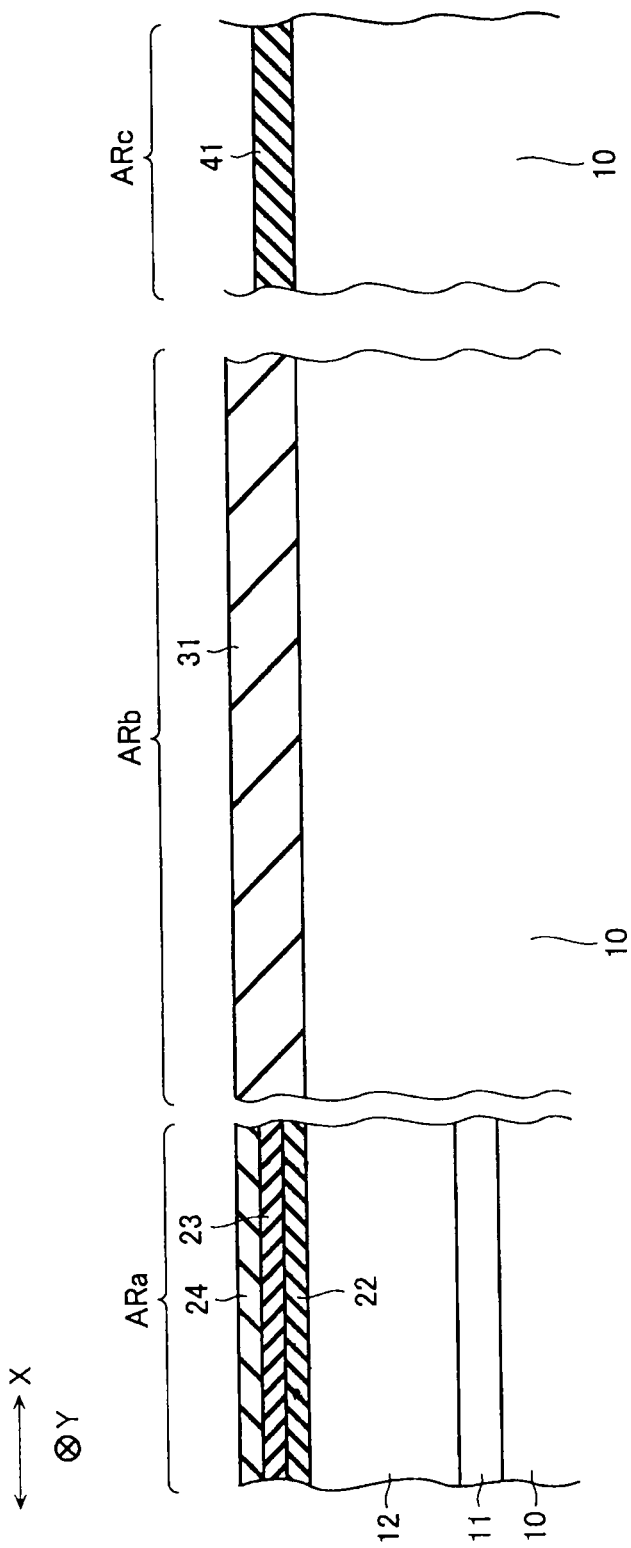
FIG. 4A is a cross-sectional view taken along X direction, illustrating a manufacturing process of the nonvolatile semiconductor memory device according to the first embodiment.

In the manufacturing processes, first, as illustrated in FIG. 4A and FIG. 4B, the tunnel insulating layer 22, the charge storage layer 23, and the block insulating layer 24 are sequentially laminated above the substrate 10 in the memory area ARa. Further, above the substrate 10, the interlayer insulating layer 31 is deposited in the resistor area ARb. Further, above the substrate 10, the gate insulating layer 41 is deposited in the transistor area ARc. Note that, these layers 22, 23, 24, 31, 41 are etched on a lump in the step of forming a device isolation region, which is performed later.

Figure 4C:
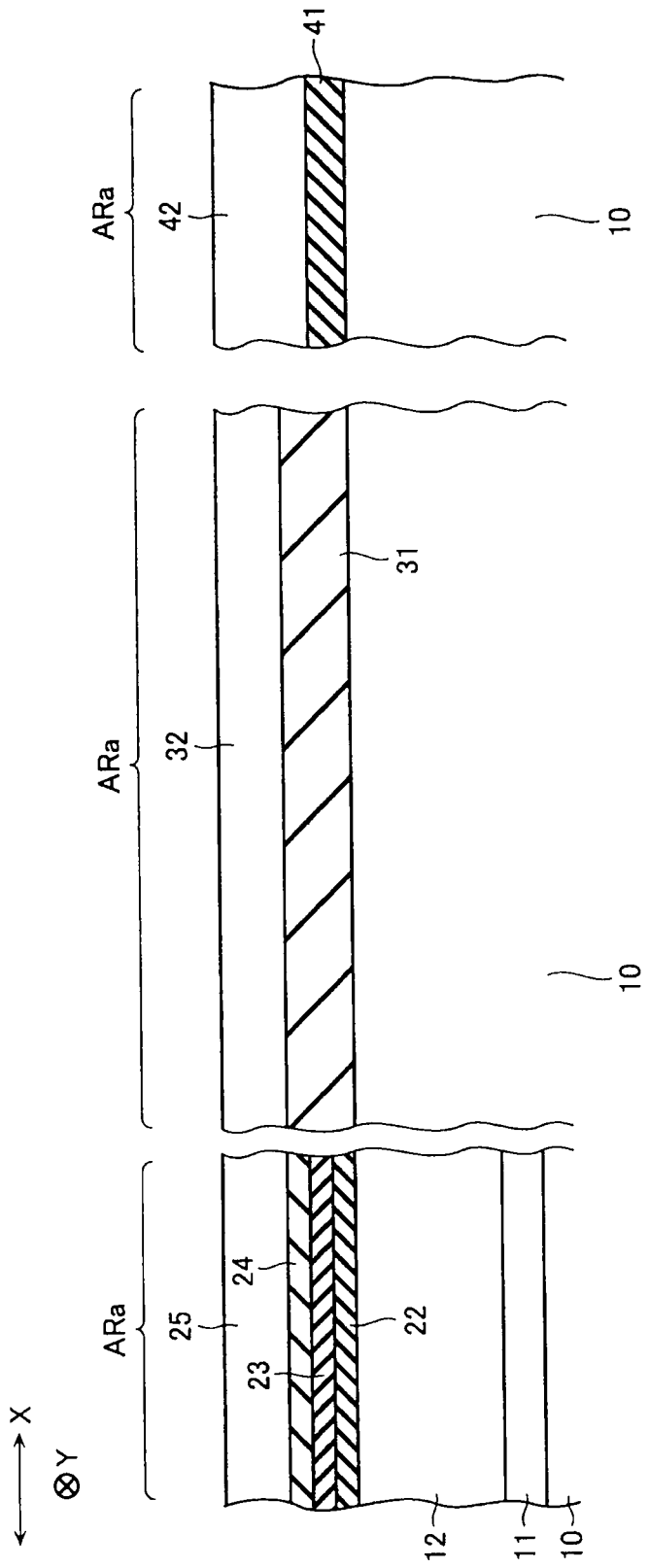
FIG. 4C is a cross-sectional view taken along X direction, illustrating a manufacturing process of the nonvolatile semiconductor memory device according to the first embodiment.

Next, as illustrated in FIG. 4C and FIG. 4D, the semiconductor layer 25 of the memory layer 20 in the memory area ARa, the semiconductor layer 32 of the resistive layer 30 in the resistor area ARb, and the semiconductor layer 42 of the transistor layer 40 in the transistor area ARc are simultaneously deposited. Then, in the steps performed later, these layers 25, 32, 42 are etched on a lump so as to form a word line of the memory transistor MTr in the memory area ARa, the resistor element RE in the resistor area ARb, and a gate of the transistor Tr in the transistor area Arc respectively. In order to decrease the number of process steps of executing an exposure process, patterning of the semiconductor layer 32 and the semiconductor layer 42 is performed using the same mask (in addition, patterning of the semiconductor layer 25 may be performed also using the same mask). Subsequently, the silicide layer 36 is formed over the entire top surface of the semiconductor layer 32 of the resistive layer 30. Specifically, after a metal (for example, Ni in the case of NiSi) that becomes an origin of silicide is laminated on the top surface of the semiconductor layer by sputtering or the like, the metal is heated to cause a silicide reaction with the semiconductor layer including polysilicon, thereby forming a silicide layer. In this embodiment, a process condition is set such that all polysilicon of the semiconductor layer is not used in the silicide reaction and a portion of the semiconductor layer remains after the reaction. If there is no semiconductor layer below the metal, the metal does not cause the silicide reaction, and is removed by etching. Therefore, the silicide layer is formed only on the semiconductor layer. At this time, the silicide layer 26 of the memory layer 20 and the silicide layer 43 of the transistor layer 40 are also simultaneously formed. Next, in FIG. 4E (state A), the silicide layer 36 is removed by etching in the range of a first area Ar1, and the silicide layers 33a and 33b are formed at both ends of the semiconductor layer 32 in the X direction. It is assumed that the first area Ar1 has a first length L1 in the X direction.

Figure 4E:
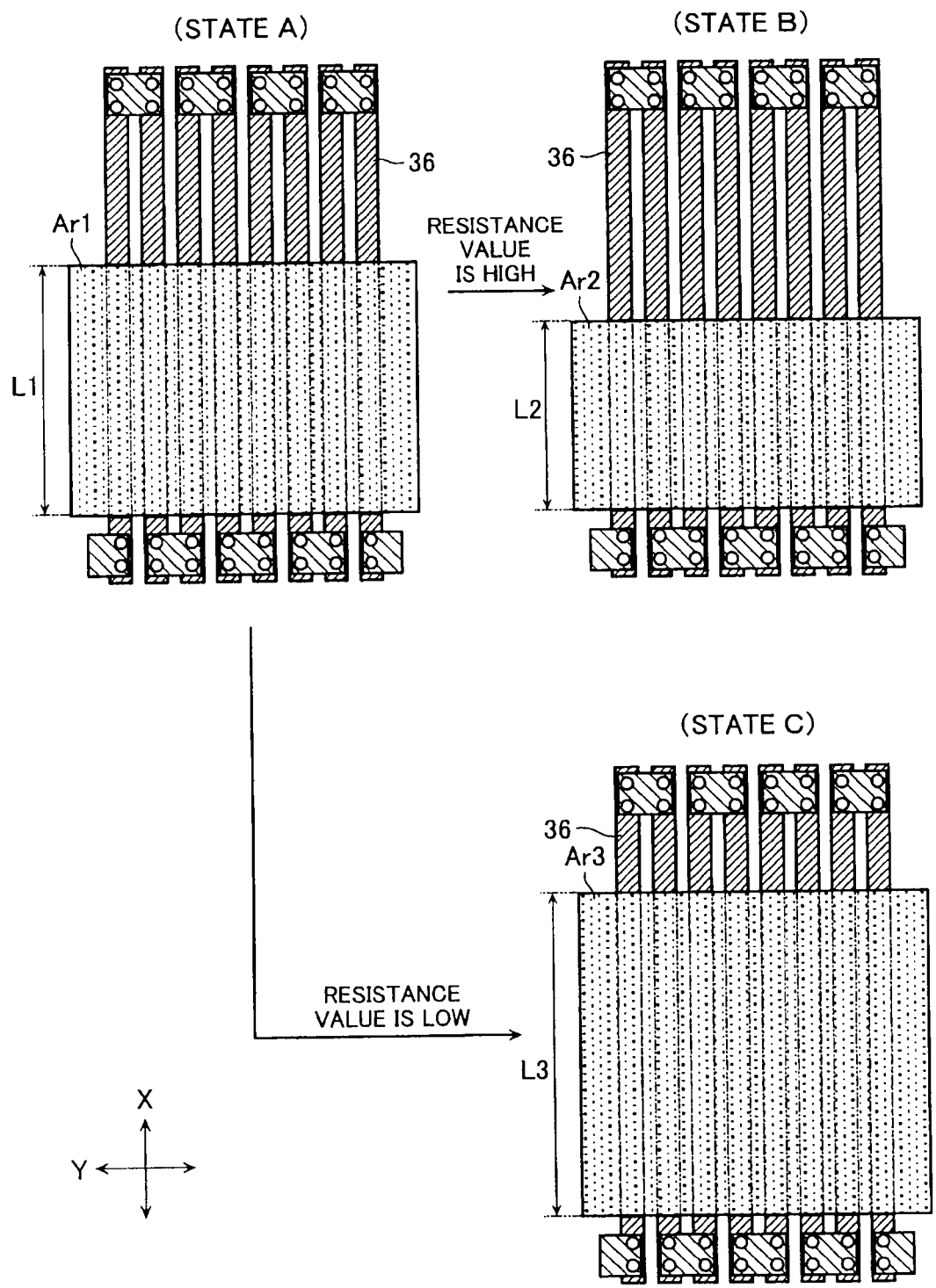
FIG. 4E illustrates a manufacturing process of the nonvolatile semiconductor memory device according to the first embodiment.

Here, when the resistance value of the resistive layer 30 in FIG. 4E (state A) is higher than a desired resistance value, as illustrated in the (state B), an etching mask is modified, the silicide layer 36 is removed by etching in the range of a second area Ar2, and the silicide layers 33a and 33b are formed. It is assumed that the second area Ar2 has a second length L2 (L2<L1) in the X direction.

Meanwhile, when the resistance value of the resistive layer 30 in FIG. 4E (state A) is lower than the desired resistance value, as illustrated in the (state C), the etching mask is modified, the silicide layer 36 is removed by etching in the range of a third area Ar3, and the silicide layers 33a and 33b are formed. It is assumed that the third area Ar3 has a third length L3 (L3>L1) in the X direction.

(Advantage of the Nonvolatile Semiconductor Memory Device According to the First Embodiment)

Next, an advantage of the nonvolatile semiconductor memory device according to the first embodiment will be described. As described above, in the nonvolatile semiconductor memory device according to the first embodiment, the resistance value of the resistive layer 30 is determined by the X-direction interval L of the silicide layers 33a and 33b formed on the semiconductor layer 32, not by the length La of the semiconductor layer 32 in the X direction. Accordingly, even when a process such as a thermal process is changed and, as a result, resistivity of the polysilicon changes, it is only necessary to create an etching mask in which the X-direction interval L is changed, and to change a eching range where the silicide layer 36 is formed on the semiconductor layer 32.

When the resistance value of the resistor layer 30 is determined by the length La of the semiconductor layer 32, it is necessary to change a mask used to process the semiconductor layer 32 and change the length La of the semiconductor layer 32. In the mask used to process the semiconductor layer 32, a critical dimension and high dimension precision are required to achieve the width $W_{GC}$ of the semiconductor layer 32 at high precision. For this reason, the mask is expensive and a long time is needed for manufacturing the mask.

Meanwhile, the mask used to process the silicide layer 36 by etching does not need high precision (a critical dimension and high dimension precision are not required). That is, the mask is inexpensive and can be manufactured in a short time. Accordingly, the nonvolatile semiconductor memory device according to the first embodiment can be manufactured at a low cost. Further, the nonvolatile semiconductor memory device according to the first embodiment can be manufactured in a short time.

Second Embodiment

Figure 5B:
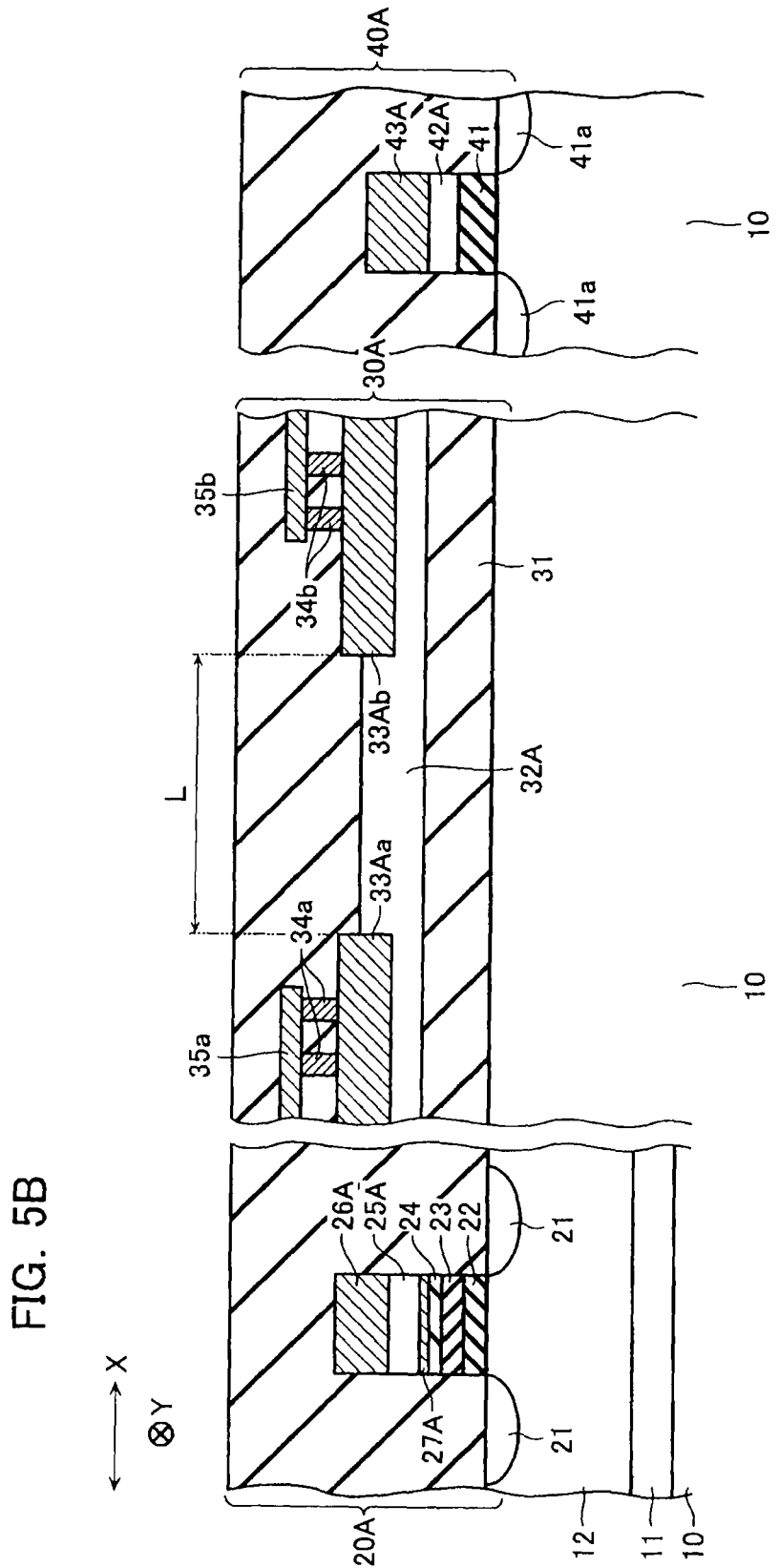
FIG. 5B is a cross-sectional view illustrating a nonvolatile semiconductor memory device according to a modification of the second embodiment.
Figure 6:
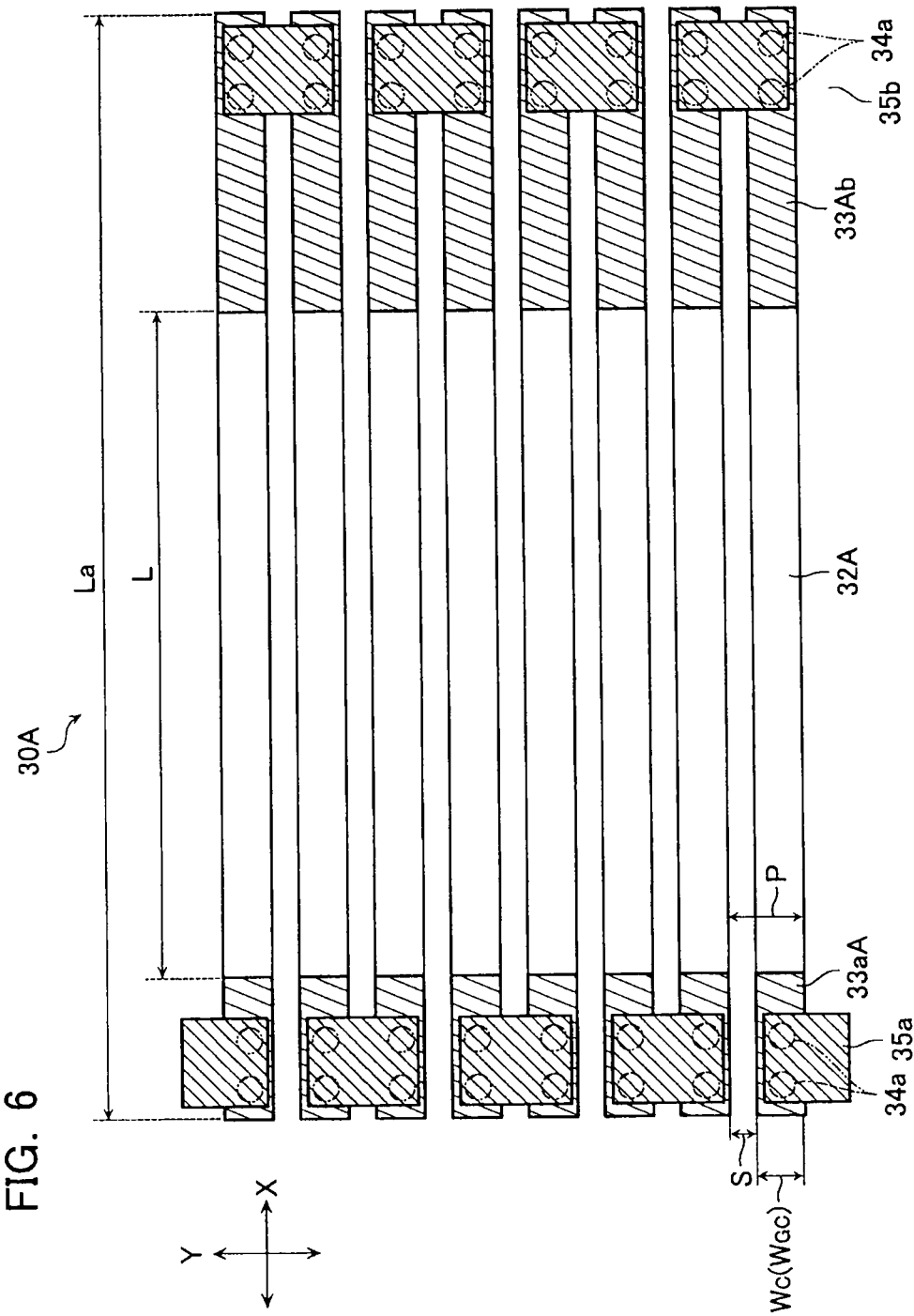
FIG. 6 is a top view illustrating a resistive layer 30A of the nonvolatile semiconductor memory device according to the second embodiment.

Lamination Structure of a Nonvolatile Semiconductor Memory Device According to a Second Embodiment Next, referring to FIGS. 5A and 6, the lamination structure of the nonvolatile semiconductor memory device according to the second embodiment will be described. FIG. 5A is a cross-sectional view illustrating the nonvolatile semiconductor memory device according to the second embodiment. FIG. 6 is a top view illustrating a resistive layer 30A, which will be described in detail below. In the second embodiment, the same components as those in the first embodiment are denoted by the same reference numerals, and the description thereof is omitted.

As illustrated in FIG. 5A, the nonvolatile semiconductor memory device according to the second embodiment includes a memory layer 20A, a resistor layer 30A, and a transistor layer 40A, which are different from those of the nonvolatile semiconductor memory device according to the first embodiment.

The memory layer 20A includes a tunnel insulating layer 22, a charge storage layer 23, a block insulating layer 24, a semiconductor layer 25A, and a silicide layer 26A, which are sequentially formed on a P-type semiconductor substrate 10. Between the block insulating layer 24 and the semiconductor layer 25A, a metal compound layer 27A such as TaN may be further inserted to improve an erasure characteristic, as illustrated in FIG. 5B.

The resistor layer 30A has a semiconductor layer 32A and silicide layers 33Aa and 33Ab, which are different from those of the first embodiment. The semiconductor layer 32A is formed to have a length La in the X direction. The semiconductor layer 32A is formed on the same layer as the semiconductor layer 25A of the memory layer 20A. The silicide layers 33Aa and 33Ab are formed to be buried in the semiconductor layer 32A from the upper side. The silicide layers 33Aa and 33Ab are formed at both sides of the semiconductor layer 32A in the X direction. The silicide layers 33Aa and 33Ab are formed on the same layer as the silicide layer 26A of the memory layer 20A.

The transistor layer 40A has a gate insulating layer 41, a semiconductor layer 42A, and a silicide layer 43A.

As illustrated in FIG. 6, the semiconductor layers 32A are formed in a stripe shape that extends in the X direction as viewed from above. The semiconductor layers 32A are arranged at a certain pitch P in the Y direction. The semiconductor layer 32A is formed to have a length La in the X direction.

The silicide layers 33Aa and 33Ab are formed in a plate shape that extends in the X direction. The silicide layer 33Aa is formed in one end of the semiconductor layer 32A in the X direction. The silicide layer 33Ab is formed in the other end of the semiconductor layer 32A in the X direction. In other words, the silicide layers 33Aa and 33Ab are formed on both ends of the semiconductor layer 32A at an interval L in the X direction.

(Method of Manufacturing a Nonvolatile Semiconductor Memory Device According to the Second Embodiment)

Figure 7:
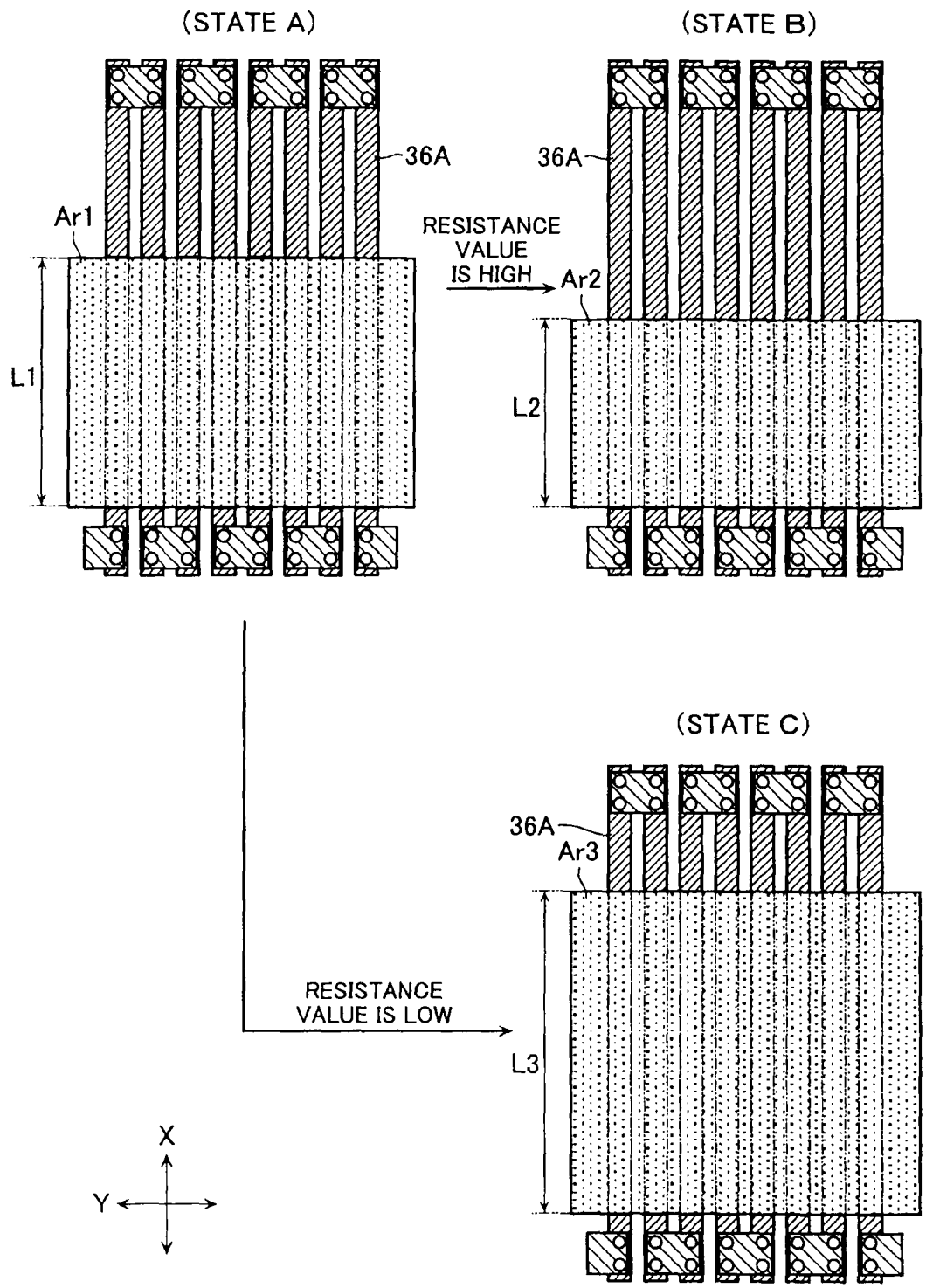
FIG. 7 illustrates a manufacturing process of the nonvolatile semiconductor memory device according to the second embodiment.

Next, a method of manufacturing a nonvolatile semiconductor memory device according to the second embodiment will be described with reference to FIG. 7. FIG. 7 schematically illustrates a part of manufacturing processes of the nonvolatile semiconductor memory device according to the second embodiment.

In the manufacturing processes, similar to the first embodiment illustrated in FIGS. 4A and 4B, first, a semiconductor layer 32A, a semiconductor layer 25A, and a semiconductor layer 42A, each of which includes polysilicon, are simultaneously processed and formed on top surfaces of a tunnel insulating layer 22 of the memory layer 20A, on an interlayer insulating layer 31 of the resistor layer 30A, and on a gate insulating layer 41 of the transistor layer 40A. In order to decrease the number of steps of executing an exposure process, patterning of the semiconductor layer 32A and the semiconductor layer 42A is performed using the same mask (in addition, patterning of the semiconductor layer 25A may be performed also using the same mask).

Next, silicon nitride (SiN) is laminated on top surfaces of the semiconductor layer 32A, the semiconductor layer 42A, and the semiconductor layer 25A, then a silicon nitride (SiN) layer 36A is removed using an etching mask, whereby a semiconductor layer formed on a position where a silicide layer is to be formed thereon is exposed. In a (state A) of FIG. 7, the silicon nitride (SiN) layer 36A out of a range of the first area Ar1 is removed by etching to expose both ends of the semiconductor layer 32A in the X direction. It is assumed that the first area Ar1 has a first length L1 in the X direction.

Subsequently, a metal (for example, Ni in the case of NiSi) that becomes an origin of silicide is laminated by sputtering or the like to contact the exposed semiconductor layer, then the metal is heated to cause a silicide reaction with the exposed semiconductor layer, thereby forming silicide layers 33Aa and 33Ab. In this embodiment, a process condition is set such that all polysilicon on the semiconductor layer is not used in the silicide reaction and a portion of the semiconductor layers 25A and 32A remain. However, the present invention is not limited thereto, and a process condition may be set such that all polysilicon on the semiconductor layer are used in the silicide reaction and the semiconductor layers 25A and 32A do not remain at the bottom. The metal that is blocked by the silicon nitride layer 36A and does not cause the silicide reaction is removed by etching. At this time, the silicide layer 26A of the memory layer 20A and the silicide layer 43A of the transistor layer 40A are also formed at the same time as the silicide layers 33Aa and 33Ab of the resistor layer 30A.

Here, when the resistance value of the resistor layer 30A in the (state A) of FIG. 7 is higher than a desired resistance value, as illustrated in the (state B) of FIG. 7, an etching mask is modified, the silicon nitride (SiN) layer 36A out of a range of the second area Ar2 is removed by etching, and the silicide layers 33Aa and 33Ab are formed. It is assumed that the second area Ar2 has a second length L2 (L2<L1) in the X direction.

Meanwhile, when the resistance value of the resistor layer 30A in the (state A) of FIG. 7 is lower than the desired resistance value, as illustrated in the (state C) of FIG. 7, the etching mask is modified, the silicon nitride (SiN) layer 36A out of a range of the third area Ar3 is removed by etching, and the silicide layers 33Aa and 33Ab are formed. It is assumed that the third area Ar3 has a third length L3 (L3>L1) in the X direction.

(Advantage of the Nonvolatile Semiconductor Memory Device According to the Second Embodiment)

Next, an advantage of the nonvolatile semiconductor memory device according to the second embodiment will be described. As described above, in the nonvolatile semiconductor memory device according to the second embodiment, the resistance value of the resistive layer 30A is determined by the X-direction interval L of the silicide layers 33Aa and 33Ab formed on the semiconductor layer 32A, not by the length La of the semiconductor layer 32A in the X direction. Accordingly, even when a process such as a thermal process is changed and, as a result, resistivity of the polysilicon changes, it is only necessary to create an etching mask in which the X-direction interval L is changed, and to change a range of the semiconductor layer 32A where the silicide layers 33Aa and 33Ab are not formed.

When the resistance value of the resistive layer 30A is determined by the length La of the semiconductor layer 32A, it is necessary to change a mask used to process the semiconductor layer 32A and change the length La of the semiconductor layer 32A. In the mask used to process the semiconductor layer 32A, a critical dimension and high dimension precision are required to achieve the width $W_{GC}$ of the semiconductor layer 32A at high precision. For this reason, the mask is expensive and a long time is needed for manufacturing the mask.

Meanwhile, the mask used to process the silicide layer 36A by etching does not need high precision (a minute dimension and high dimension precision are not required). That is, the mask is inexpensive and can be manufactured in a short time. Accordingly, the nonvolatile semiconductor memory device according to the second embodiment can be manufactured at a low cost. Further, the nonvolatile semiconductor memory device according to the second embodiment can be manufactured in a short time.

Third Embodiment

Figure 8:
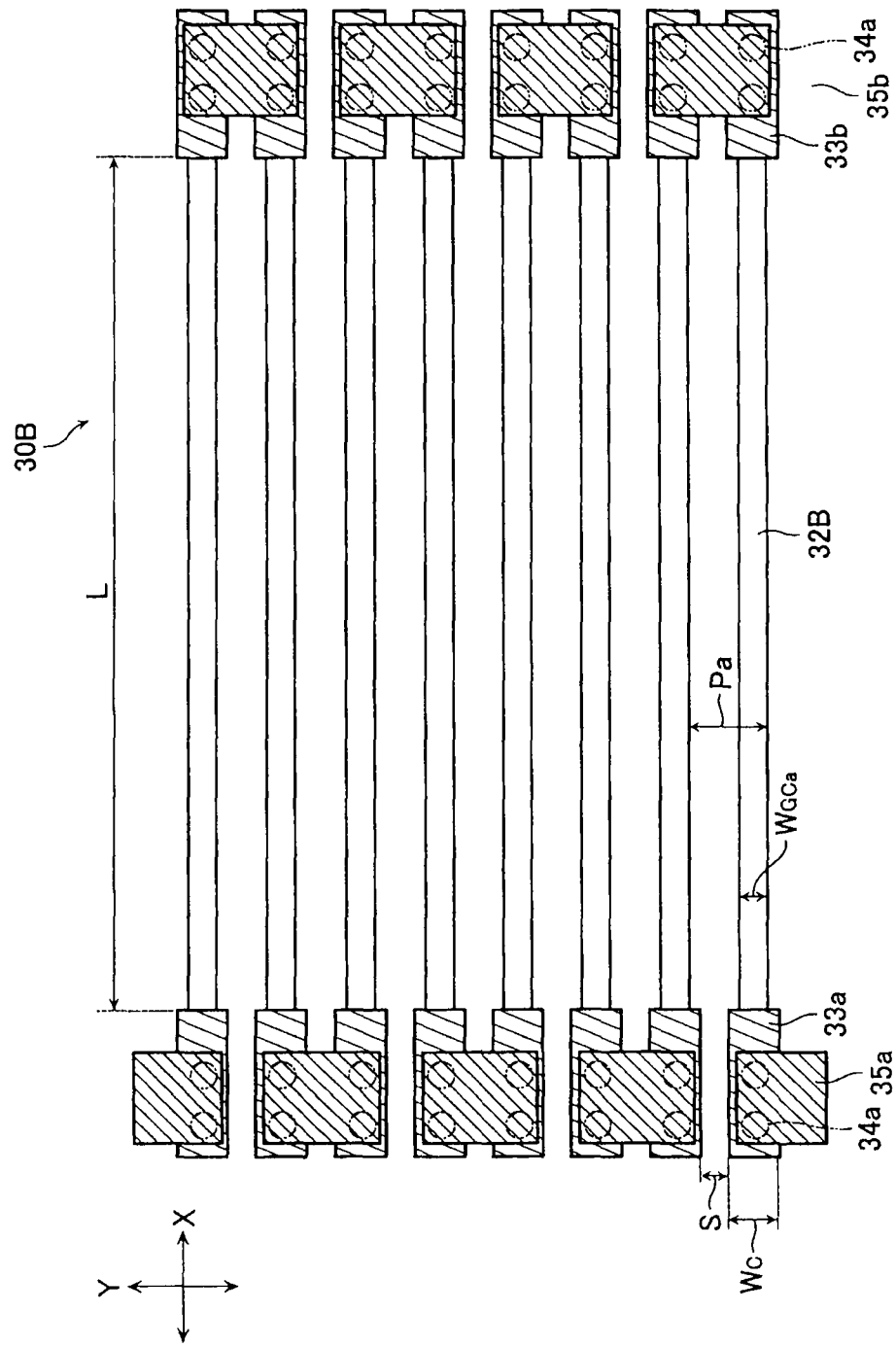
FIG. 8 is a top view illustrating a resistive layer 30B of a nonvolatile semiconductor memory device according to a third embodiment of the present invention.

Lamination Structure of a Nonvolatile Semiconductor Memory Device According to a Third Embodiment Next, referring to FIG. 8, the lamination structure of the nonvolatile semiconductor memory device according to the third embodiment will be described. FIG. 8 is a top view illustrating a resistor layer 30B of the nonvolatile semiconductor memory device according to the third embodiment. In the third embodiment, the same components as those in the first and second embodiments are denoted by the same reference numerals, and the description thereof is omitted.

As illustrated in FIG. 8, the nonvolatile semiconductor memory device according to the third embodiment includes the resistor layer 30B, which are different from those of the nonvolatile semiconductor memory devices according to the first and second embodiments. The resistor layer 30B has a semiconductor layer 32B, which is different from those of the first and second embodiments.

A width $W_{GCa}$ of the semiconductor layer 32B in the Y direction is smaller than a width $W_C$ of silicide layers 33a and 33b in the Y direction. The width $W_C$ of the silicide layers 33a and 33b in the Y direction is equal to those in the first and second embodiments. This is because the silicide layers 33a and 33b need to contact plug layers 34a and 34b at the top surfaces thereof.

Specifically, the width $W_{GCa}$ of the semiconductor layer 32B in the Y direction is 0.25 µm. The width $W_C$ of the silicide layers 33a and 33b in the Y direction is 0.3 µm, as in the first and second embodiments. A distance S at which the resistor layers 30B are closest to each other in the Y direction is 0.1 µm. That is, a pitch Pa of the semiconductor layer 32B in the Y direction is 0.4 µm ($W_C$+S).

(Advantage of the Nonvolatile Semiconductor Memory Device According to the Third Embodiment)

Next, an advantage of the nonvolatile semiconductor memory device according to the third embodiment will be described. Since the nonvolatile semiconductor memory device according to the third embodiment has the same configuration as the first embodiment, the same effect as the first embodiment can be achieved. Further, the nonvolatile semiconductor memory device according to the third embodiment includes the semiconductor layer 32B that has the Y-direction width smaller than those of the silicide layers 33a and 33b. Accordingly, the nonvolatile semiconductor memory device according to the third embodiment can configure the resistor element RE having a resistance value higher than those of the first and second embodiments by the resistor layer 30B.

Fourth Embodiment

Figure 9:
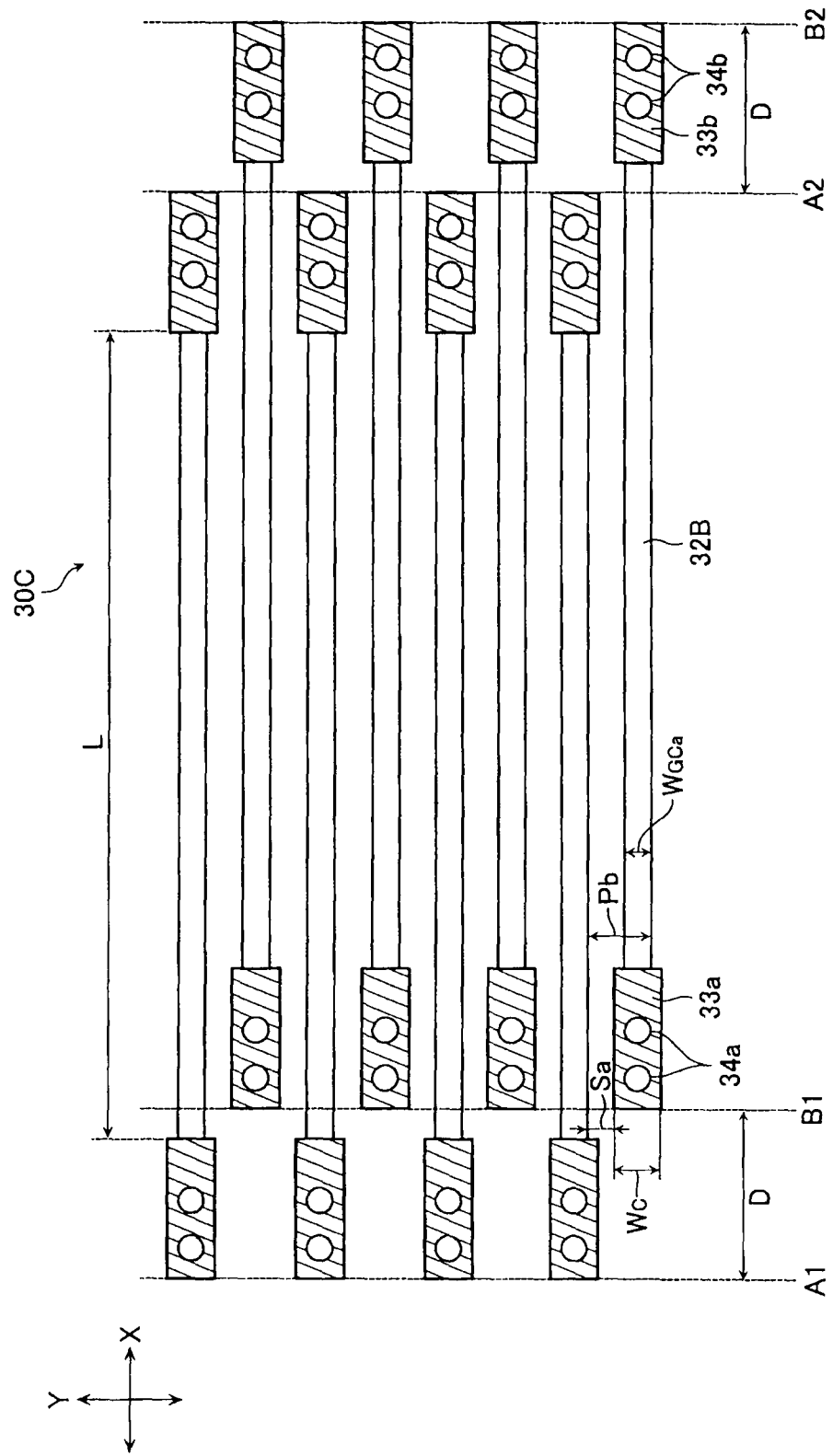
FIG. 9 is a top view illustrating a resistive layer 30C of a nonvolatile semiconductor memory device according to a fourth embodiment of the present invention.

Lamination Structure of a Nonvolatile Semiconductor Memory Device According to a Fourth Embodiment Next, referring to FIG. 9, the lamination structure of the nonvolatile semiconductor memory device according to the fourth embodiment will be described. FIG. 9 is a top view illustrating a resistor layer 30C of the nonvolatile semiconductor memory device according to the fourth embodiment. FIG. 9 illustrates a state where the wiring layers 35a and 35b are removed. In the fourth embodiment, the same components as those in the first to third embodiments are denoted by the same reference numerals, and the description thereof is omitted.

As illustrated in FIG. 9, the nonvolatile semiconductor memory device according to the fourth embodiment includes the resistor layer 30C, which is different from those of the nonvolatile semiconductor memory devices according to the first to third embodiments. In the resistor layer 30C, the semiconductor layers 32B that are arranged in the Y direction are formed out of alignment to one another in the X direction at edges thereof. That is, the odd-numbered silicide layers 33a and 33b that are arranged in the Y direction are formed such that ends thereof are arranged at positions A1 and A2 in the X direction. Further, the even-numbered silicide layers 33a and 33b that are arranged in the Y direction are formed such that ends thereof are arranged at positions B1 and B2 in the X direction. The silicide layers are apart by a certain distance D in the X direction between the positions A1 and B1, and are apart by the certain distance D in the X direction between the positions A2 and B2.

Specifically, a width $W_{GCa}$ of the semiconductor layer 32B in the Y direction is 0.2 µm. A width $W_C$ of the silicide layers 33a and 33b in the Y direction is 0.3 µm. A distance Sa at which the resistor layers 30C are closest to each other in the Y direction is 0.1 µm. That is, a pitch Pb of the semiconductor layer 32B in the Y direction is 0.35 µm (($W_{GCa}$+$W_C$)/2+Sa). That is, in the nonvolatile semiconductor memory device according to the fourth embodiment, the pitch of the semiconductor layer 32B in the Y direction can be decreased by 0.05 µm (($W_C$−$W_{GCa}$)/2), as compared to the nonvolatile semiconductor memory device according to the third embodiment. For example, an occupied area formed when the seven semiconductor layers 32B are arranged in the Y direction in the third embodiment becomes equal to an occupied area formed when the eight semiconductor layers 32B are arranged in the Y direction in the fourth embodiment.

(Advantage of the Nonvolatile Semiconductor Memory Device According to the Fourth Embodiment)

Figure 10:
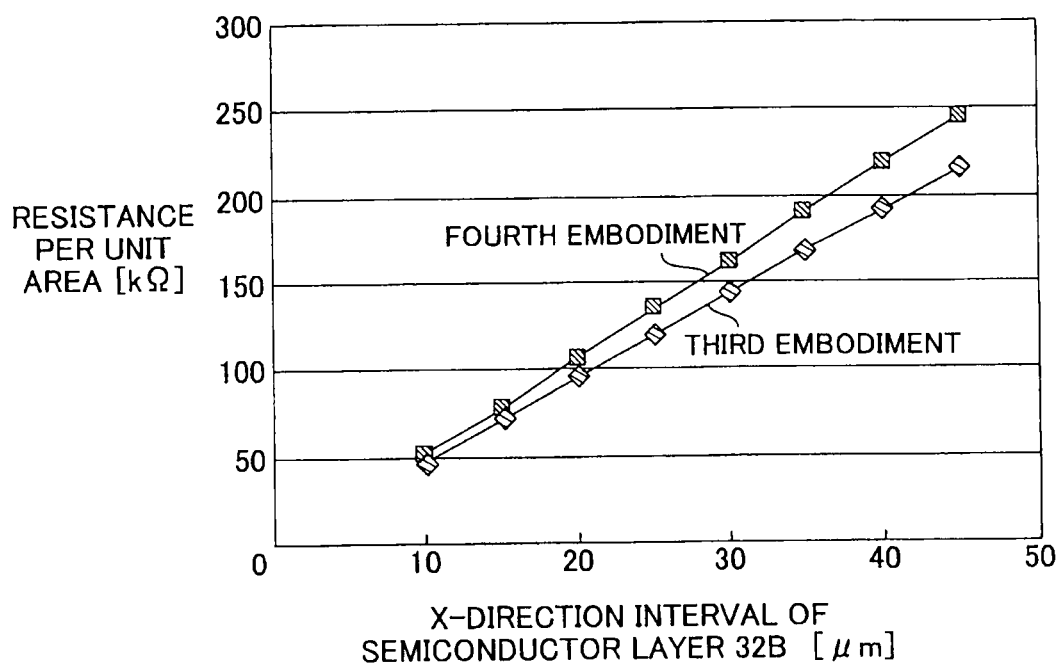
FIG. 10 illustrates an effect of the nonvolatile semiconductor memory device according to the fourth embodiment.

Next, an advantage of the nonvolatile semiconductor memory device according to the fourth embodiment will be described with reference to FIG. 10. FIG. 10 illustrates a resistance value per unit area of the fourth embodiment according to the variation of the semiconductor layer 32B in the X direction and a resistance value per unit area of the third embodiment. The semiconductor layers 32B that are arranged in the Y direction are formed out of alignment to one another in the X direction at edges thereof. Therefore, the pitch of the semiconductor layer 32B in the Y direction may be small. Consequently, as illustrated in FIG. 10, as compared to the nonvolatile semiconductor memory device according to the third embodiment, the nonvolatile semiconductor memory device according to the fourth embodiment can increase the resistance value per unit area.

Fifth Embodiment

Figure 11:
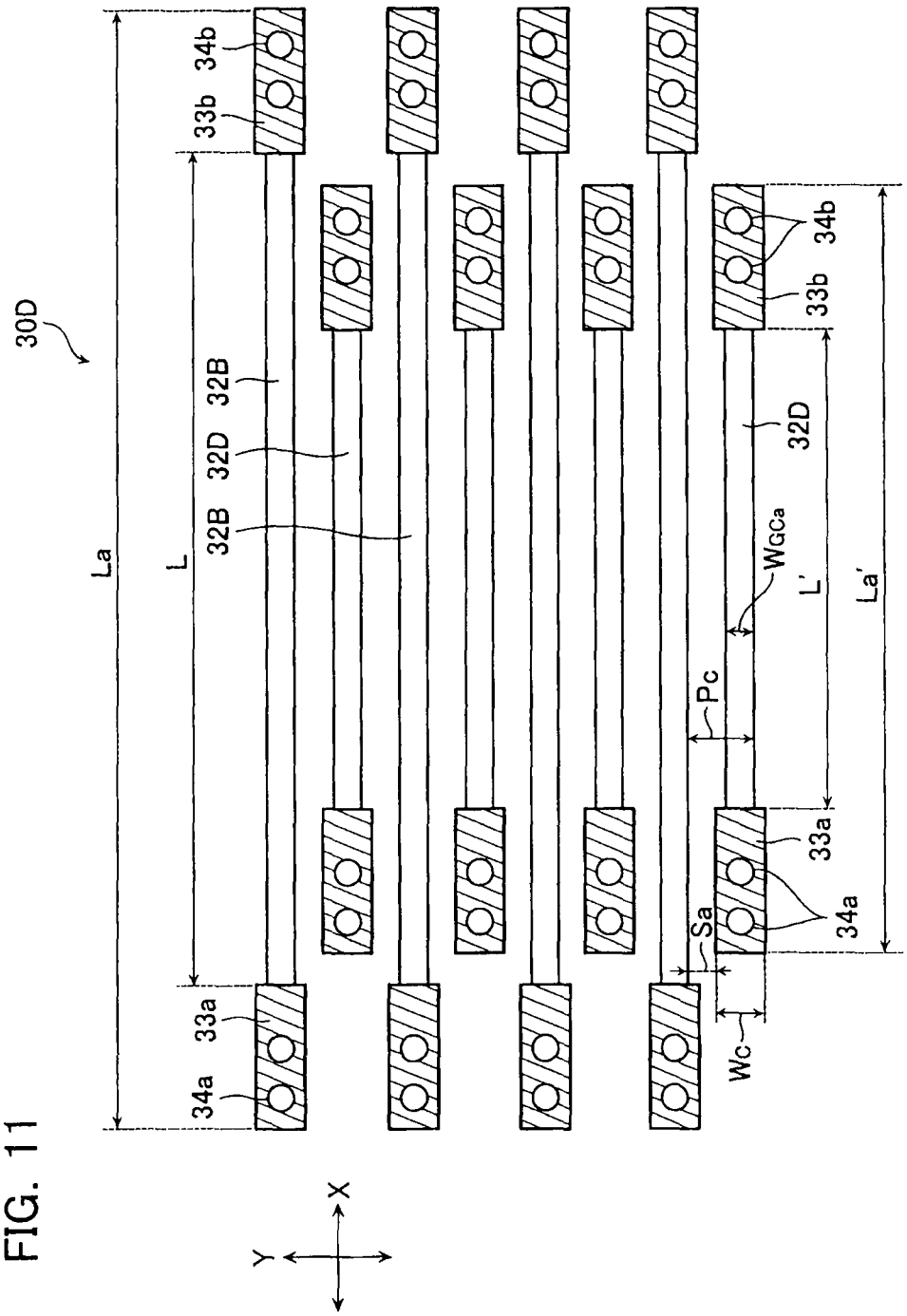
FIG. 11 is a top view illustrating a resistive layer 30D of a nonvolatile semiconductor memory device according to a fifth embodiment of the present invention.

Lamination Structure of a Nonvolatile Semiconductor Memory Device According to a Fifth Embodiment Next, referring to FIG. 11, the lamination structure of the nonvolatile semiconductor memory device according to the fifth embodiment will be described. FIG. 11 is a top view illustrating a resistive layer 30D of the nonvolatile semiconductor memory device according to the fifth embodiment. In the fifth embodiment, the same components as those in the first to fourth embodiments are denoted by the same reference numerals, and the description thereof is omitted.

As illustrated in FIG. 11, the nonvolatile semiconductor memory device according to the fifth embodiment includes the resistor layer 30D, which is different from those of the nonvolatile semiconductor memory devices according to the first to fourth embodiments. In the resistor layer 30D, in addition to the same semiconductor layer 32B as those in the third and fourth embodiments, a semiconductor layer 32D which is different from those in the third and fourth embodiments is provided. The semiconductor layers 32B and 32D are alternately provided in the Y direction. The semiconductor layers 32B and 32D are arranged to align the centers thereof with respect to the X direction. The semiconductor layer 32B is formed to have a length La in the X direction. The semiconductor layer 32D is formed to have a length La' (La'<La) in the X direction.

The silicide layers 33a and 33b are formed on the semiconductor layer 32D, similar to the semiconductor layer 32B. The silicide layers 33a and 33b are formed at both ends of the semiconductor layer 32D in the X direction. The silicide layers 33a and 33b are formed on the semiconductor layer 32B at an interval L in the X direction. The silicide layers 33a and 33b are formed on the semiconductor layer 32D at an interval L' (L'<L) in the X direction.

A width $W_{GCa}$ of the semiconductor layers 32B and 32D in the Y direction is 0.2 µm. A width $W_C$ of the silicide layers 33a and 33b in the Y direction is 0.3 µm. A distance Sa at which the resistive layers 30D are closest to each other in the Y direction is 0.1 µm. That is, a pitch Pc of the semiconductor layers 32B and 32D in the Y direction is 0.35 µm (($W_{GCa}$+$W_C$)/2+Sa).

(Advantage of the Nonvolatile Semiconductor Memory Device According to the Fifth Embodiment)

Next, an advantage of the nonvolatile semiconductor memory device according to the fifth embodiment will be described. The nonvolatile semiconductor memory device according to the fifth embodiment can achieve the same effect as that of the fourth embodiment.

Sixth Embodiment

Figure 12:
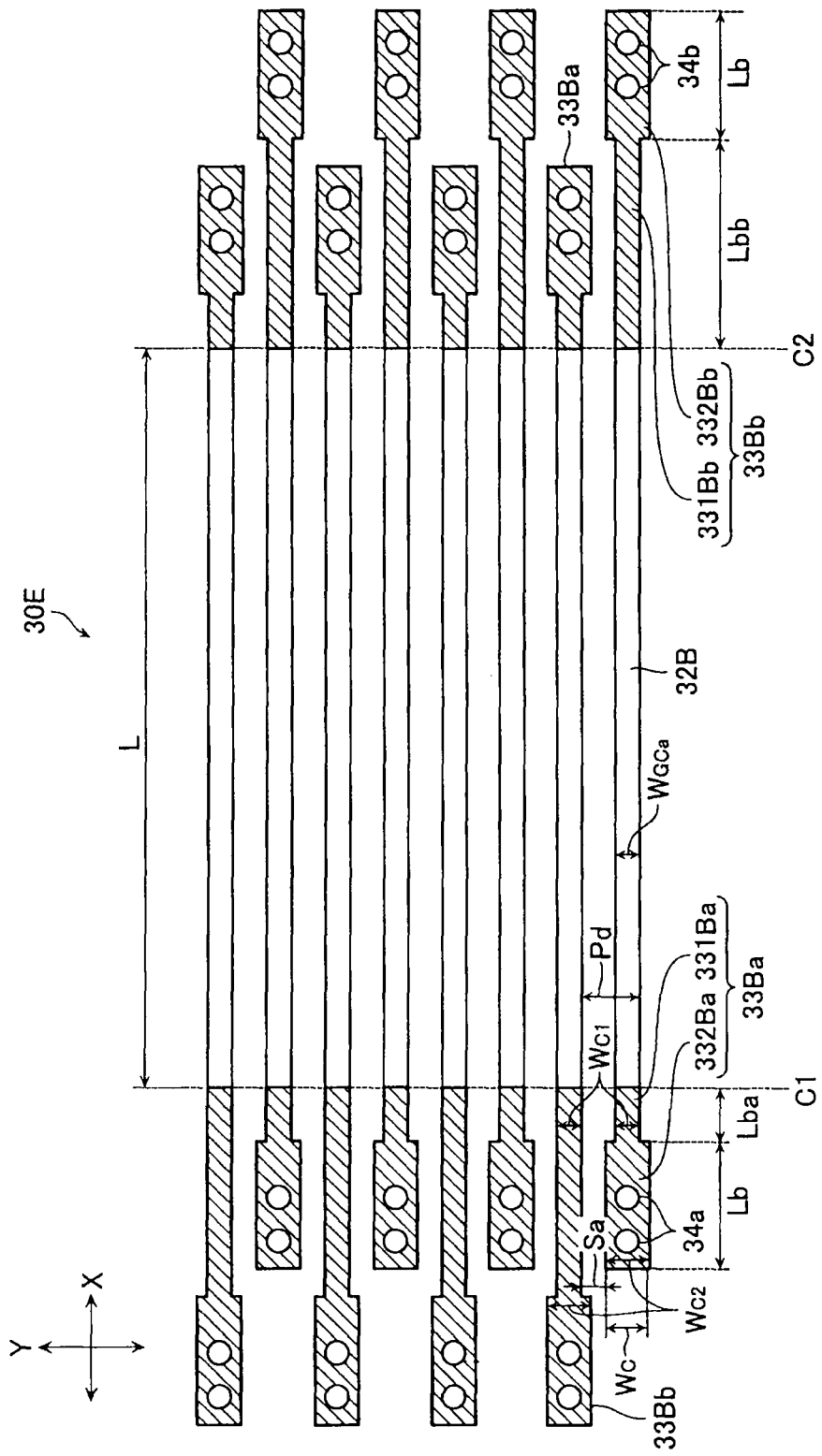
FIG. 12 is a top view illustrating a resistive layer 30E of a nonvolatile semiconductor memory device according to a sixth embodiment of the present invention.

Lamination Structure of a Nonvolatile Semiconductor Memory Device According to a Sixth Embodiment Next, referring to FIG. 12, the lamination structure of the nonvolatile semiconductor memory device according to the sixth embodiment will be described. FIG. 12 is a top view illustrating a resistor layer 30E of the nonvolatile semiconductor memory device according to the sixth embodiment. In the sixth embodiment, the same components as those in the first to fifth embodiments are denoted by the same reference numerals, and the description thereof is omitted.

As illustrated in FIG. 12, the nonvolatile semiconductor memory device according to the sixth embodiment includes the resistor layer 30E, which is different from those of the nonvolatile semiconductor memory devices according to the first to fourth embodiments. The resistor layer 30E has silicide layers 33Ba and 33Bb, which are different from those in the first to fourth embodiments. The silicide layers 33Ba and 33Bb are alternately provided in the Y direction. The silicide layers 33Ba and 33Bb are formed at both ends of the semiconductor layer 32B in the X direction at an interval L, respectively. The silicide layers 33Ba and 33Bb are formed such that ends thereof are arranged at a position C1 in the X direction. Further, the silicide layers 33Ba and 33Bb are formed such that the ends thereof are arranged at a position C2 in the X direction. The positions C1 and C2 are apart from each other by the interval L.

The silicide layers 33Ba and 33Bb are formed to have an approximately convex shape. The silicide layer 33Ba has a first shape portion 331Ba and a second shape portion 332Ba. The first shape portion 331Ba is provided between the silicide layers 33Bb that are arranged in the Y direction. The first shape portion 331Ba has a width $W_n$ equal to the width $W_{GCa}$ of the semiconductor layer 32B in the Y direction, and is formed in a rectangular shape, having a first length Lba in the X direction. The second shape portion 332Ba has a width $W_{C2}$ larger than the width $W_{GCa}$ of the semiconductor layer 32B in the Y direction, and is formed in a rectangular shape, having a second length Lb in the X direction and being continuously connected to one end of the first shape portion 331Ba. Further, the first shape portion 331Ba is formed such that the other end thereof is arranged at the position C1 or C2.

The silicide layer 33Bb has a first shape portion 331Bb and a second shape portion 332Bb. The second shape portion 332Bb is provided between the silicide layers 33Ba that are arranged in the Y direction. The first shape portion 331Bb has the width $W_{C1}$ equal to the width $W_{GCa}$ of the semiconductor layer 32B in the Y direction, and is formed in a rectangular shape, having a third length Lbb (Lbb>Lba) in the X direction. The second shape portion 332Bb has the width $W_{C2}$ larger than the width $W_{GCa}$ of the semiconductor layer 32B in the Y direction, and is formed in a rectangular shape, having the second length Lb in the X direction and being continuously connected to one end of the first shape portion 331Bb. Further, the first shape portion 331Bb is formed such that the other end thereof is arranged at the position C1 or C2.

The width $W_n$ of the first shape portions 331Ba and 331Bb of the silicide layers 33Ba and 33Bb in the Y direction is 0.2 μm. The width $W_{C2}$ of the second shape portions 332Ba and 332Bb of the silicide layers 33Ba and 33Bb in the Y direction is 0.3 μm. A distance Sa at which the resistive layers 30E are closest to each other in the Y direction is 0.1 μl. That is, a pitch Pd of the semiconductor layer 32B in the Y direction is 0.35 μm (($W_{GCa}+W_{C2}$)/2+Sa).

(Method of Manufacturing a Nonvolatile Semiconductor Memory Device According to the Sixth Embodiment)

Figure 13:
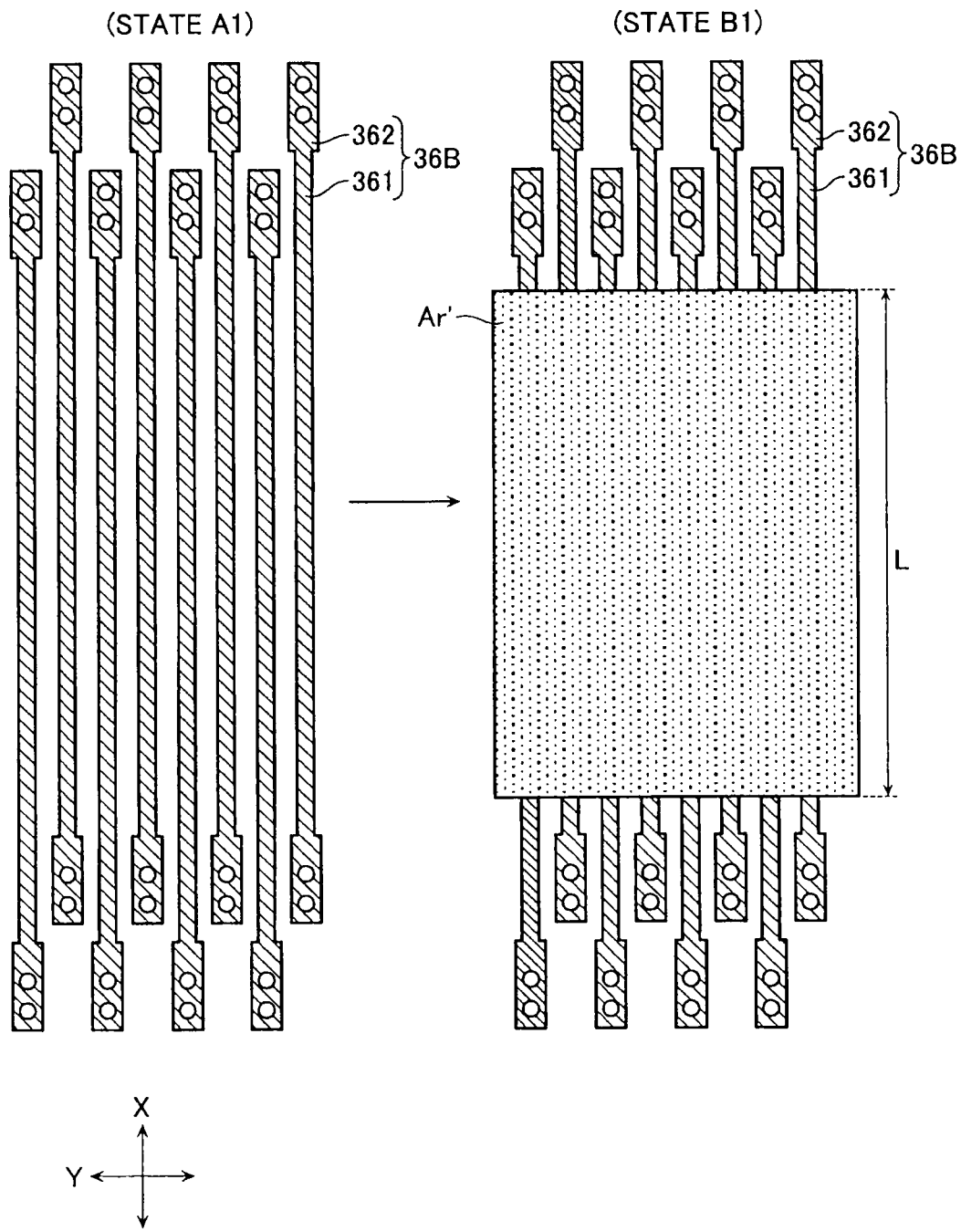
FIG. 13 illustrates a manufacturing process of the nonvolatile semiconductor memory device according to the sixth embodiment.

Next, a method of manufacturing a nonvolatile semiconductor memory device according to the sixth embodiment will be described with reference to FIG. 13. FIG. 13 schematically illustrates manufacturing processes of the nonvolatile semiconductor memory device according to the sixth embodiment.

First, as illustrated in the (state A1) of FIG. 13, the silicide layer 36B is formed on the top surface of the semiconductor layer 32B. The silicide layers 41A that are arranged in the Y direction are formed to be alternately shifted in the X direction. Portions near both ends of the silicide layer 36B in the X direction are formed to have a wide width in the Y direction. The silicide layer 36B has a first shape portion 361 and a second shape portion 362. The first shape portion 361 is formed in a rectangular plate shape that extends in the X direction. The width of the first shape portion 361 in the Y direction is equal to the width of the semiconductor layer 32B in the Y direction. The second shape portion 362 is formed at both ends of the first shape portion 361 in the X direction. The second shape portion 362 is formed in a rectangular plate shape that extends in the X direction. The width of the second shape portion 362 in the Y direction is larger than the width of the semiconductor layer 32B in the Y direction.

Subsequently, as illustrated in the (state B1) of FIG. 13, the silicide layer 41 is removed by etching in the range of an area Ar', and the silicide layers 33Ba and 33Bb are formed at both ends of the semiconductor layer 32B in the X direction. The area Ar' has a length L in the X direction. Even in the sixth embodiment, similar to the first embodiment, a resistance value of the resistor element RE can be easily changed by changing the length of the area Ar' in the X direction.

(Advantage of the Nonvolatile Semiconductor Memory Device According to the Sixth Embodiment)

Next, an advantage of the nonvolatile semiconductor memory device according to the sixth embodiment will be described. The nonvolatile semiconductor memory device according to the sixth embodiment can achieve the same effect as those in the fourth and fifth embodiments. Further, since the nonvolatile semiconductor memory device according to the sixth embodiment is formed using the above-described manufacturing method, the nonvolatile semiconductor memory device can be manufactured at a low cost. Further, the nonvolatile semiconductor memory device according to the sixth embodiment can be manufactured in a short time.

Other Embodiments

The embodiments of the nonvolatile semiconductor memory device have been described, but the present invention is not limited to the above embodiments. Various modifications, additions, and replacements can be made without departing from the spirit and scope of the present invention.

What is claimed is:

1. A nonvolatile semiconductor memory device comprising:
   a memory cell; and
   a resistor element provided around the memory cell, the memory cell including:
a charge storage layer provided above a substrate;
a first semiconductor layer formed on a top surface of the charge storage layer via an insulating layer, the first semiconductor layer having a plain top surface; and
a first low resistive layer formed on a top surface of the first semiconductor layer and having a resistance lower than that of the first semiconductor layer,
the resistor element includes:
a second semiconductor layer formed in the same layer as the first semiconductor layer, the second semiconductor having a plain top surface with the same height as the plain top surface of the first semiconductor layer; and
a second low resistive layer formed in the same layer as the first low resistive layer and on a top surface of the second semiconductor layer,
the second semiconductor layer being formed to extend in a first direction parallel to the substrate, and
the second low resistive layer being formed at both ends of the second semiconductor layer, and
wherein:
the resistor element includes an interlayer insulation layer formed on the substrate, a surface of the interlayer insulation layer having the same height as a surface of the insulating layer; and
the second semiconductor layer is formed directly on the interlayer insulation layer.

2. The nonvolatile semiconductor memory device according to claim 1, wherein each of the first low resistive layer and the second low resistive layer includes silicide.

3. The nonvolatile semiconductor memory device according to claim 1, wherein a conductor layer including a metal compound is inserted between the first semiconductor layer and the insulating layer.

4. The nonvolatile semiconductor memory device according to claim 1, wherein a plurality of the second semiconductor layers are formed to be arranged at a certain pitch in a second direction orthogonal to a lamination direction and the first direction and have a certain length in the first direction, and the plurality of second semiconductor layers arranged in the second direction are formed out of alignment to one another in the first direction.

5. The nonvolatile semiconductor memory device according to claim 1, wherein a plurality of the second semiconductor layers are formed to be arranged at a certain pitch in a second direction orthogonal to a lamination direction and the first direction, with centers thereof with respect to the first direction being aligned along the second direction and with a first length and a second length alternatively.

6. The nonvolatile semiconductor memory device according to claim 1, wherein a width of the second semiconductor layer in a second direction orthogonal to the first direction is smaller than a width of the second low resistive layer in the second direction.

7. The nonvolatile semiconductor memory device according to claim 1, wherein the second low resistive layer includes:
a first shape portion formed in a rectangular shape having a first width in a second direction orthogonal to the first direction; and
a second shape portion having a second width larger than the first width in the second direction and formed in a rectangular shape continuous to one end of the first shape portion,
the other ends of a plurality of the first shape portions are arranged at a certain position of the first direction, and
the first width is equal to a width of the second semiconductor layer in the second direction.

8. The nonvolatile semiconductor memory device according to claim 1, wherein the resistor element further includes:
a plurality of plug layers extending in a lamination direction from a top surface of the second low resistive layer; and
a wiring layer formed to come in contact with top surfaces of the plurality of plug layers.

9. The nonvolatile semiconductor memory device according to claim 1, further comprising a transistor formed on the substrate,
wherein the transistor includes:
a gate insulating layer formed above the substrate;
a third semiconductor layer formed on a top surface of the gate insulating layer; and
a third low resistive layer formed on a top surface of the third semiconductor layer and having resistance lower than that of the third semiconductor layer.

10. The nonvolatile semiconductor memory device according to claim 1, further comprising:
a reference potential generation circuit configured to generate a reference potential; and
an voltage generation circuit configured to generate an voltage based on the reference potential,
wherein the resistor element is provided in the reference potential generation circuit and the voltage generation circuit.

11. The nonvolatile semiconductor memory device according to claim 1, wherein each of the first semiconductor layer and the second semiconductor layer includes polysilicon.

12. The nonvolatile semiconductor memory device according to claim 1, wherein the charge storage layer includes silicon nitride.

13. The nonvolatile semiconductor memory device according to claim 2, wherein the silicide is any one of nickel silicide, tungsten silicide, and cobalt silicide.

14. The nonvolatile semiconductor memory device according to claim 3, wherein the conductor layer includes TaN.

15. The nonvolatile semiconductor memory device according to claim 8, wherein each of the plug layer and the wiring layer includes metal.

16. The nonvolatile semiconductor memory device according to claim 1, wherein the second low resistive layer is formed to be buried in the second semiconductor layer.

* * * * *